United States Patent
Cok

(10) Patent No.: US 9,513,759 B2
(45) Date of Patent: *Dec. 6, 2016

(54) MULTI-LAYER MICRO-WIRE STRUCTURE

(71) Applicant: Eastman Kodak Company, Rochester, NY (US)

(72) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 165 days.

This patent is subject to a terminal disclaimer.

(21) Appl. No.: 14/217,544

(22) Filed: Mar. 18, 2014

(65) Prior Publication Data
US 2015/0268770 A1    Sep. 24, 2015

(51) Int. Cl.
*H01L 29/41*    (2006.01)
*G06F 3/047*    (2006.01)
(Continued)

(52) U.S. Cl.
CPC .............. *G06F 3/047* (2013.01); *G06F 3/044* (2013.01); *H01L 29/413* (2013.01); *H01L 33/42* (2013.01); *H01L 51/5215* (2013.01); *H05K 1/0289* (2013.01); *H05K 1/0298* (2013.01); *H05K 1/09* (2013.01); *H05K 1/117* (2013.01); *H05K 3/465* (2013.01); *G06F 2203/04103* (2013.01); *G06F 2203/04112* (2013.01); *H05K 3/4664* (2013.01); *H05K 2201/0376* (2013.01); *H05K 2201/09036* (2013.01); *H05K 2201/09045* (2013.01); *H05K 2201/09845* (2013.01); *Y10T 29/49155* (2015.01)

(58) Field of Classification Search
CPC ........ G06F 3/047; G06F 3/044; H01L 29/413; H01L 33/42; H01L 51/5215
USPC ........................................... 438/52
See application file for complete search history.

(56) References Cited

U.S. PATENT DOCUMENTS

| 8,179,381 B2 | 5/2012 | Frey et al. |
| 2010/0026664 A1 | 2/2010 | Geaghan |

(Continued)

FOREIGN PATENT DOCUMENTS

CN    102063951    5/2011

*Primary Examiner* — Amar Movva
(74) *Attorney, Agent, or Firm* — Raymond L. Owens; Kevin E. Spaulding

(57) ABSTRACT

A multi-layer micro-wire structure includes first and second substrates having first and second layers extending to first and second layer edges, respectively. The first layer includes first micro-wire electrodes and first connection pads. Each first micro-wire electrode includes one or more electrically connected first micro-wires and each first connection pad electrically connects to a corresponding first micro-wire electrode. The second layer includes second micro-wire electrodes and second connection pads. Each second micro-wire electrode includes one or more electrically connected second micro-wires, and each second connection pad electrically connects to a corresponding second micro-wire electrode. The second layer is located between the first substrate and the second substrate and the second layer edge extends at least partly beyond the first layer edge so that one or more of the second connection pads is located between at least a portion of the first layer edge and the second layer edge.

20 Claims, 23 Drawing Sheets

(51) Int. Cl.
*H01L 33/42* (2010.01)
*H01L 51/52* (2006.01)
*G06F 3/044* (2006.01)
*H05K 1/02* (2006.01)
*H05K 1/11* (2006.01)
*H05K 3/46* (2006.01)
*H05K 1/09* (2006.01)

(56) References Cited

U.S. PATENT DOCUMENTS

| | | |
|---|---|---|
| 2010/0328248 A1 | 12/2010 | Mozdzyn |
| 2011/0007011 A1 | 1/2011 | Mozdzyn |
| 2011/0099805 A1 | 5/2011 | Lee |
| 2011/0289771 A1 | 12/2011 | Kuriki |
| 2011/0291966 A1 | 12/2011 | Takao et al. |
| 2012/0163696 A1* | 6/2012 | Ross ............... G01R 33/04 382/135 |
| 2013/0224370 A1* | 8/2013 | Cok ............... G06F 3/041 427/108 |
| 2014/0041924 A1* | 2/2014 | Cok ............... G06F 3/044 174/268 |
| 2014/0043280 A1* | 2/2014 | Cok ............... G06F 3/0412 345/174 |
| 2015/0268770 A1* | 9/2015 | Cok ............... G06F 3/047 345/174 |
| 2015/0271930 A1* | 9/2015 | Cok ............... G06F 3/044 156/60 |

* cited by examiner

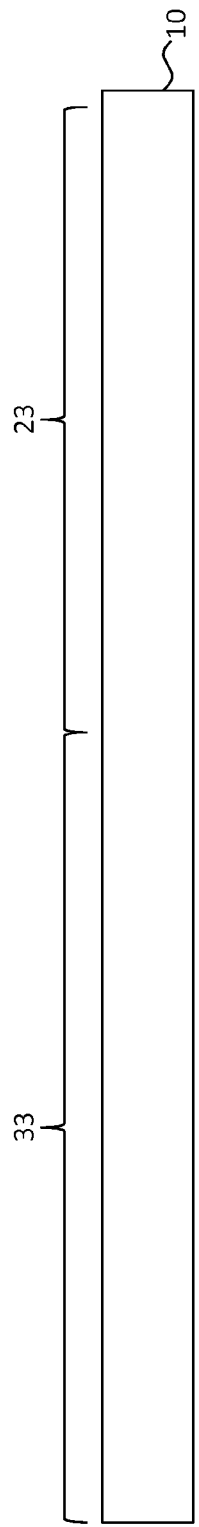
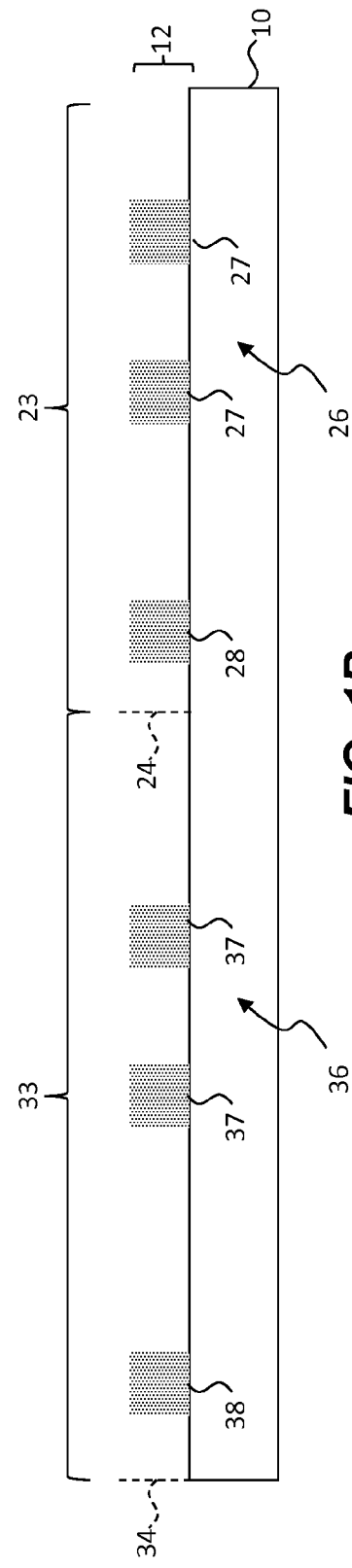
FIG. 1A
FIG. 1B

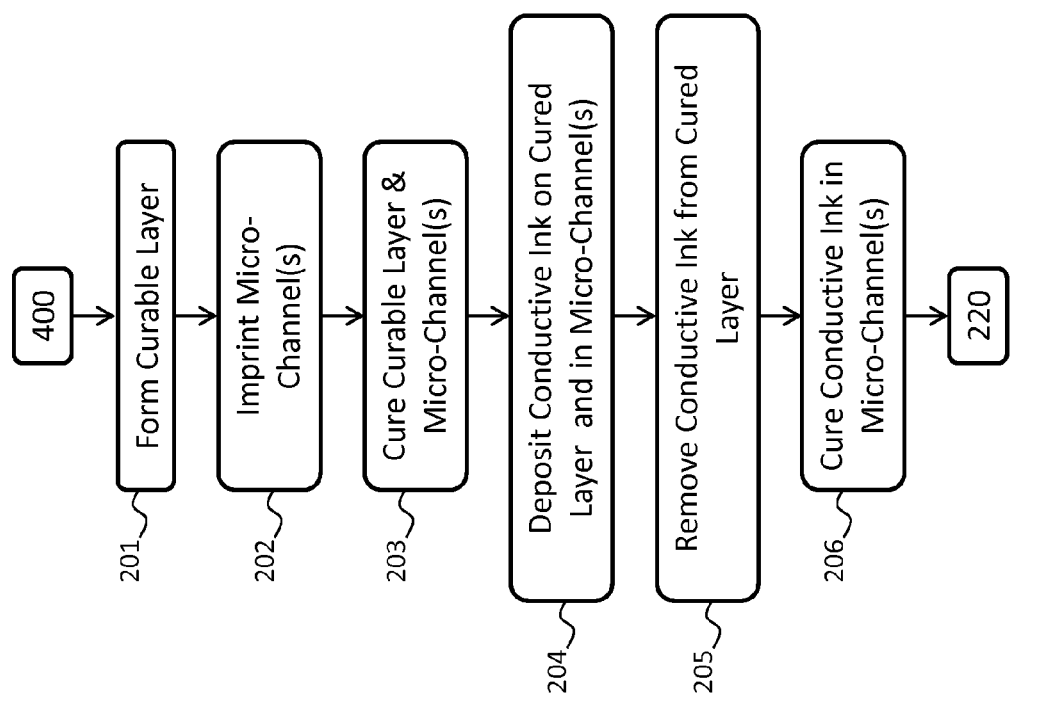

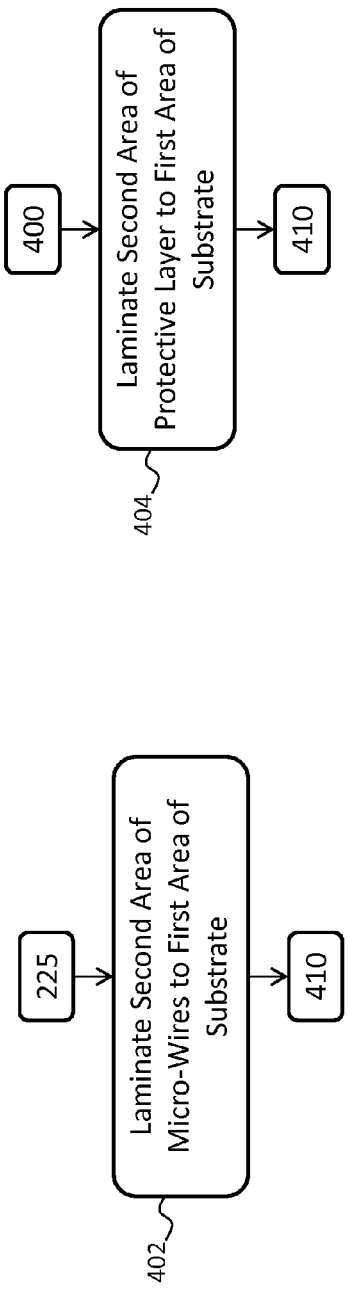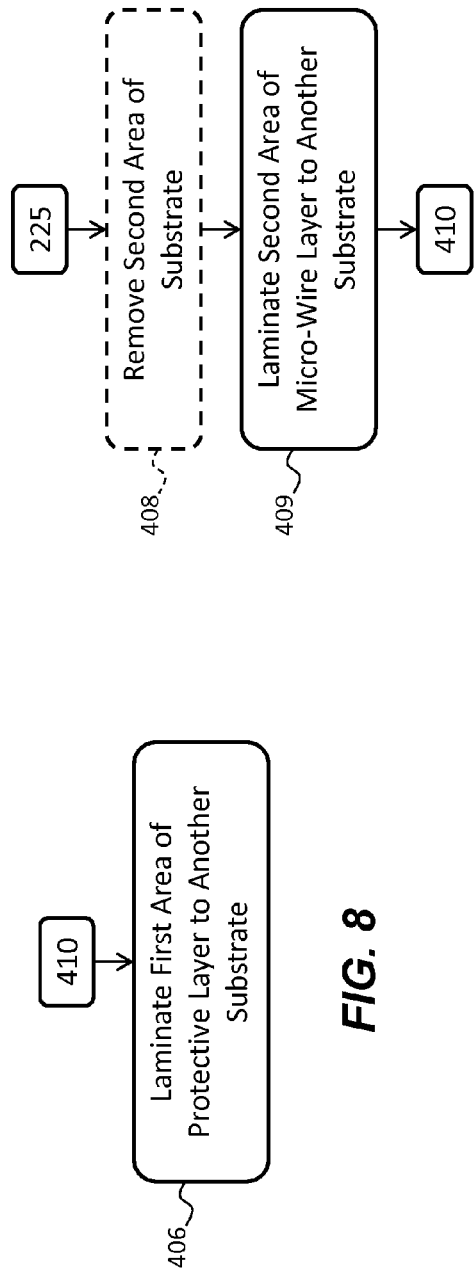

MULTI-LAYER MICRO-WIRE STRUCTURE

CROSS REFERENCE TO RELATED APPLICATIONS

Reference is made to commonly-assigned, co-pending U.S. patent application Ser. No. 14/217,539, filed Mar. 18, 2014, entitled "Making Multi-Layer Micro-Wire Structure" by Ronald S. Cok, and commonly-assigned, co-pending U.S. patent application Ser. No. 14/217,546, filed Mar. 18, 2014, entitled "Multi-Area Micro-Wire Structure" by Ronald S. Cok, the disclosures of which are incorporated herein.

Reference is made to commonly-assigned, U.S. patent application Ser. No. 14/023,740 (now U.S. Pat. No. 9,107,316), filed Sep. 11, 2013, entitled "Multi-Layer Micro-Wire Substrate Structure" by Ronald S. Cok and to commonly-assigned, U.S. patent application Ser. No. 14/023,757 (now U.S. Publication No. 2015/0068032), filed Sep. 11, 2013, entitled "Multi-Layer Micro-Wire Substrate Method" by Ronald S. Cok, the disclosures of which are incorporated herein.

FIELD OF THE INVENTION

The present invention relates to substrate structures and methods for making substrate structures having imprinted micro-wires.

BACKGROUND OF THE INVENTION

Transparent conductors are widely used in the flat-panel display industry to form electrodes that are used to electrically switch light-emitting or light-transmitting properties of a display pixel, for example, in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example, silver or aluminum or metal alloys including silver or aluminum. These materials are coated, for example, by sputtering or vapor deposition, and are patterned on display or touch-screen substrates, such as glass.

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that is supplied to the pixel elements. Although thicker layers of metal oxides or metals increase conductivity, they also reduce the transparency of the electrodes.

Transparent electrodes, including very fine patterns of conductive elements, such as metal wires or conductive traces are known. For example, U.S. Patent Publication No. 2011/0007011 teaches a capacitive touch screen with a mesh electrode, as do U.S. Patent Publication No. 2010/0026664, U.S. Patent Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between 0.5 μ and 4 μ wide and a transparency of between approximately 86% and 96%.

Conductive micro-wires are formed in micro-channels embossed in a substrate, for example as taught in CN102063951, which is hereby incorporated by reference in its entirety. As discussed in CN102063951, a pattern of micro-channels are formed in a substrate using an embossing technique. Embossing methods are generally known in the prior art and typically include coating a curable liquid, such as a polymer, onto a rigid substrate. A pattern of micro-channels is embossed (impressed or imprinted) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

Referring to FIG. 24, a prior-art display and touch-screen system 100 includes a display 110 with a corresponding touch screen 120 mounted with the display 110 so that information displayed on the display 110 is viewed through the touch screen 120. Graphic elements displayed on the display 110 are selected, indicated, or manipulated by touching a corresponding location on the touch screen 120. The touch screen 120 includes a first transparent substrate 122 with first transparent electrodes 130 formed in the X dimension on the first transparent substrate 122 and a second transparent substrate 126 with second transparent electrodes 132 formed in the Y dimension facing the X dimension first transparent electrodes 130 on the second transparent substrate 126. A dielectric layer 124 is located between the first and second transparent substrates 122, 126 and first and second transparent electrodes 130, 132. The first and second transparent substrates 122, 126, and dielectric layer 124 are formed separately and laminated together.

The first and second transparent electrodes 130, 132 have a variable width and extend in orthogonal directions (for example as shown in U.S. Patent Application Publication Nos. 2011/0289771 and 2011/0099805). When a voltage is applied across the first and second transparent electrodes 130, 132, electric fields are formed between the first pad areas 128 of the X dimension first transparent electrodes 130 and the second pad areas 129 of the Y dimension second transparent electrodes 132.

A display controller 142 connected through electrical buss connections 136 controls the display 110 in cooperation with a touch-screen controller 140. The touch-screen controller 140 is connected to the first and second transparent electrodes 130, 132 through electrical buss connections 136 and wires 134 and controls the touch screen 120. The touch-screen controller 140 detects touches on the touch screen 120 by sequentially electrically energizing and testing the X dimension first and Y dimension second transparent electrodes 130, 132.

U.S. Patent Application Publication No. 2011/0291966 discloses an array of diamond-shaped micro-wire structures. In this disclosure, a first electrode includes a plurality of first conductor lines inclined at a predetermined angle in clockwise and counterclockwise directions with respect to a first direction and provided at a predetermined interval to form a grid-shaped pattern. A second electrode includes a plurality of second conductor lines, inclined at the predetermined angle in clockwise and counterclockwise directions with respect to a second direction, the second direction perpendicular to the first direction and provided at the predetermined interval to form a grid-shaped pattern. This arrangement is used to inhibit Moiré patterns. The electrodes are used in a touch screen device. Referring to FIG. 25, this prior-art design includes micro-wires 150 arranged in a micro-pattern 156 with the micro-wires 150 oriented at an angle to the direction of horizontal first transparent electrodes 130 and vertical second transparent electrodes 132. The horizontal first transparent electrodes 130 are formed on an opposite side of a transparent substrate from the vertical second transparent electrodes 132.

The structure of FIG. 24 has first and second transparent substrates 122, 126 and a dielectric layer 124. This requires the construction of first transparent electrodes 130 on first transparent substrate 122 and the separate construction of second transparent electrodes 132 on second transparent substrate 126. The first and second transparent substrates 122, 126 are then aligned and laminated together.

SUMMARY OF THE INVENTION

There is a need, therefore, for alternative substrate and multi-layer micro-wire structures that enable fewer manufacturing steps and a more efficient process for manufacturing transparent electrodes having micro-wires in an imprinted micro-wire micro-pattern.

In accordance with the present invention, a multi-layer micro-wire structure comprises:

a first substrate and a first layer in contact with the first substrate, the first layer extending to a first layer edge and including one or more first micro-wire electrodes and one or more first connection pads, each first micro-wire electrode including one or more electrically connected first micro-wires, and each first connection pad electrically connected to a corresponding first micro-wire electrode;

a second substrate and a second layer in contact with the second substrate, the second layer extending to a second layer edge and including one or more second micro-wire electrodes and one or more second connection pads, each second micro-wire electrode including one or more electrically connected second micro-wires, and each second connection pad electrically connected to a corresponding second micro-wire electrode; and wherein the second layer is located between the first substrate and the second substrate and wherein the second layer edge extends at least partly beyond the first layer edge so that one or more of the second connection pads is located between at least a portion of the first layer edge and the second layer edge.

The present invention provides a multi-layer micro-wire structure, a multi-area micro-wire structure, and a method of making a multi-layer micro-wire structure with fewer manufacturing steps.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 1A-1D are successive cross sections illustrating a method of the present invention;

FIGS. 5-9 are flow diagrams illustrating methods of the present invention;

The Figures are not drawn to scale since the variation in size of various elements in the Figures is too great to permit depiction to scale.

DETAILED DESCRIPTION OF THE INVENTION

The present invention is directed toward multi-layer and multi-area micro-wire structures and methods of making such structures with improved efficiency and reduced cost. In an embodiment, the multi-layer micro-wire structure is used in a capacitive touch screen or in conjunction with a display device.

Figure 1C:
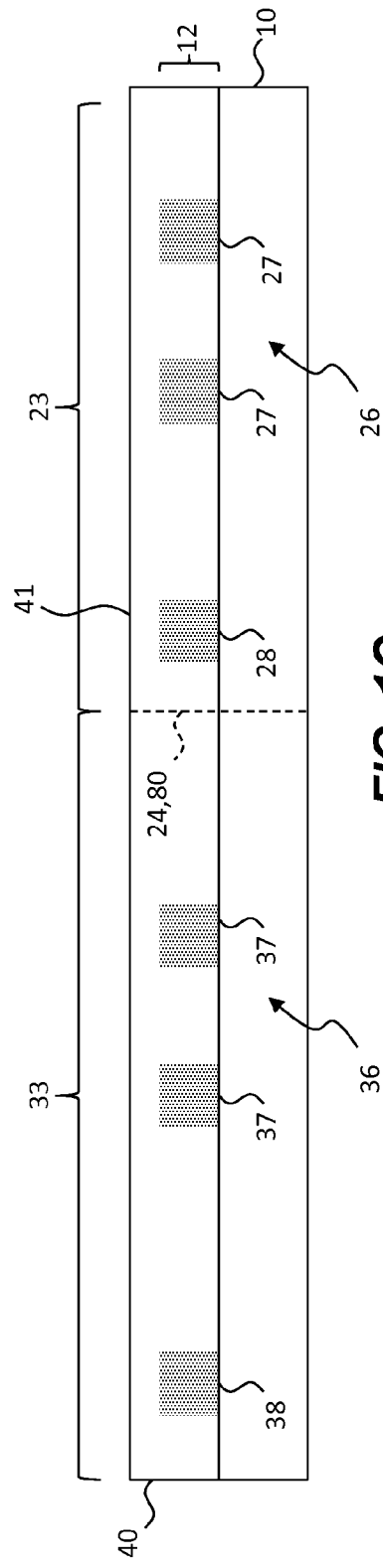
Figure 1D:
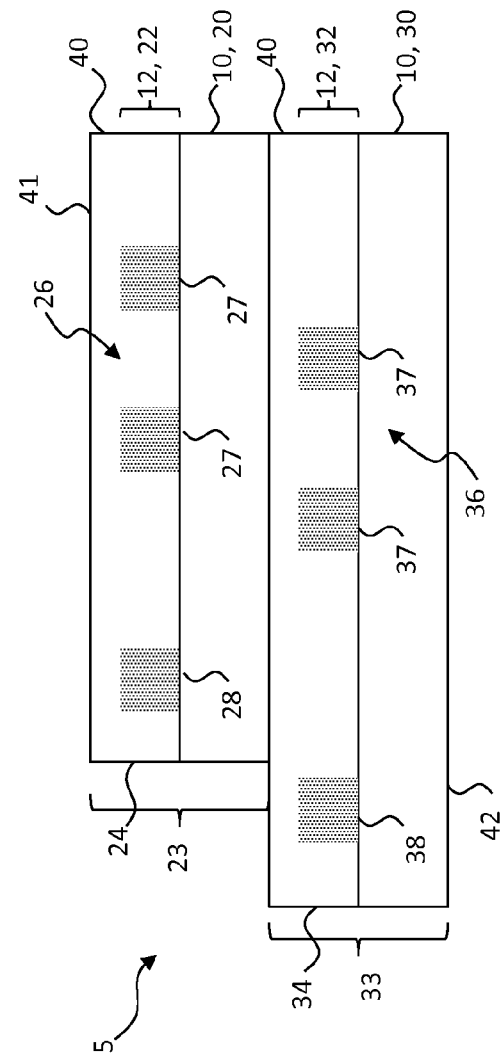
Figure 2:
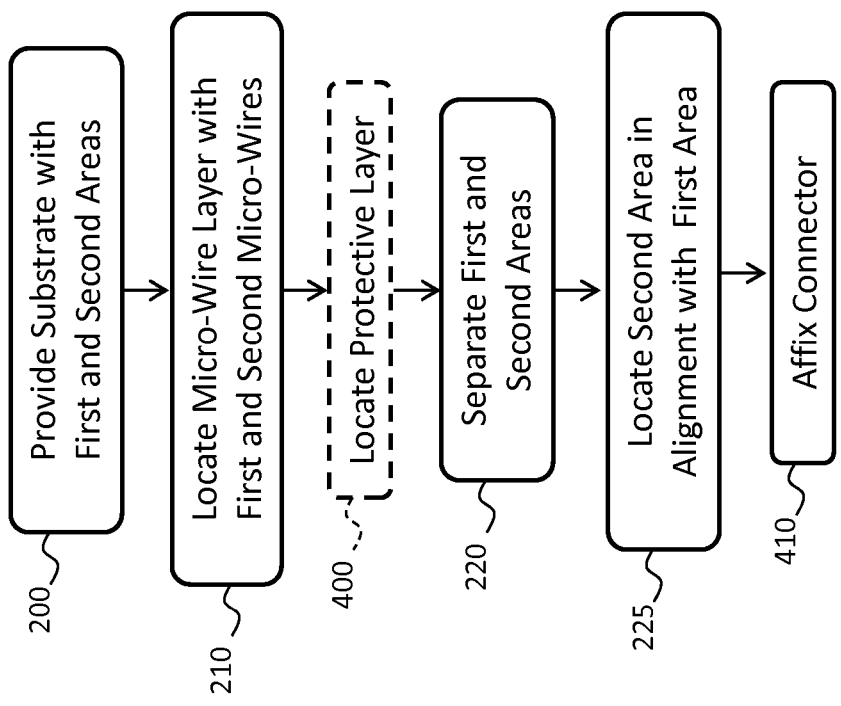

Referring to the cross sections of FIGS. 1A-1D and to the flow diagram of FIG. 2, in an embodiment of the present invention a method of making a multi-layer micro-wire structure 5 (FIG. 1D) includes providing a substrate 10 having first and second distinct and separated areas 23, 33 (FIG. 1A) in step 200. Referring to FIG. 1B, a micro-wire layer 12 is located in contact with the substrate 10 in step 210. The micro-wire layer 12 has a first layer edge 24 and a second layer edge 34 different from the first layer edge 24. The micro-wire layer 12 also has first and second distinct and separated areas 23, 33 spatially corresponding to the first and second distinct and separated areas 23, 33 of the substrate 10.

The micro-wire layer 12 includes one or more first micro-wire electrodes 26 and one or more first connection pads 28 in the micro-wire layer 12 in the first area 23. Each first micro-wire electrode 26 includes one or more electrically connected first micro-wires 27 and each first connection pad 28 is electrically connected to a corresponding first micro-wire electrode 26. The micro-wire layer 12 also includes one or more second micro-wire electrodes 36 and one or more second connection pads 38 in the micro-wire layer 12 in the second area 33. Each second micro-wire electrode 36 includes one or more electrically connected second micro-wires 37 and each second connection pad 38 is electrically connected to a corresponding second micro-wire electrode 36. The first micro-wires 27 and the second micro-wires 37 are located in a common step and can include common materials. In an embodiment, the first connection pads 28 can include the first micro-wires 27 and the second connection pads 38 can include the second micro-wires 37. In another embodiment, the first and second connection pads 28, 38 are formed in a common step with the first and second micro-wires 27, 37 or with common materials.

Figure 10:
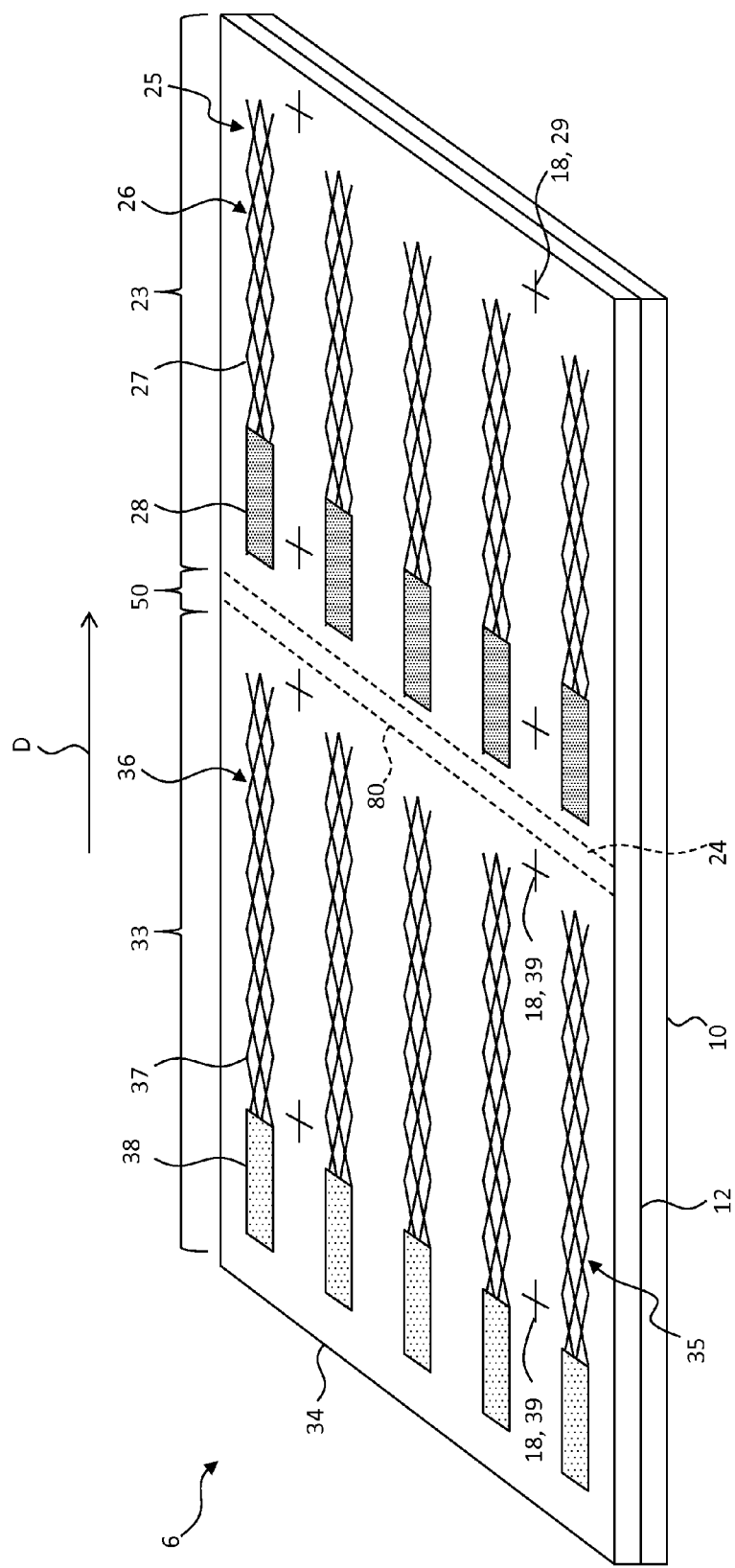
FIG. 10 is a perspective of an embodiment of the present invention.

FIG. 10 is a perspective of the structure illustrated in the cross section of FIG. 1B. As shown in FIG. 10, in an embodiment of the present invention, a multi-area micro-wire structure 6 includes the substrate 10 and the micro-wire layer 12 located in contact with the substrate 10. The substrate 10 and the micro-wire layer 12 have corresponding first and second distinct and separated areas 23, 33. The first area 23 has a first layer edge 24 and the second area 33 has a second layer edge 34 different from the first layer edge 24. The second area 33 is larger than the first area 23. One or more first micro-wire electrodes 26 and one or more first connection pads 28 are located in or on the micro-wire layer 12 in the first area 23. Each first micro-wire electrode 26 includes one or more electrically connected first micro-wires 27 and each first connection pad 28 is located adjacent to the first layer edge 24 and electrically connected to a corresponding first micro-wire electrode 26. One or more second micro-wire electrodes 36 and one or more second connection pads 38 are located in the micro-wire layer 12 in or on the second area 33. Each second micro-wire electrode 36 includes one or more electrically connected second micro-wires 37 and each second connection pad 38 is located adjacent to the second layer edge 34 and electrically connected to a corresponding second micro-wire electrode 36. An optional spacing area 50 can separate the first and second areas 23, 33 and can include a cut line 80. In an embodiment, the cut line 80 is straight; in another embodiment the cut line 80 is not straight, for example the cut line 80 forms a square wave or a crenellated pattern.

Referring to FIG. 1C, in optional step 400 protective layer 40 is located over the micro-wire layer 12 to protect the micro-layer 12 and provide a touch surface 41 over the micro-wire layer 12. The protective layer 40 can have a thickness equal to or greater than a thickness of the substrate 10. The protective layer 40 also includes first and second distinct and separate areas 23, 33 spatially corresponding to the first and second areas 23, 33, of the substrate 10. The first area 23 of the substrate 10, the micro-wire layer 12, and the protective layer 40 (if present) is separated from the second area 33 of the substrate 10, the micro-wire layer 12, and the protective layer 40 (if present) in step 220, for example by mechanically cutting the micro-wire layer 12 and the substrate 10 along the cut line 80, for example with a knife or punch, or by scribing and breaking, or with a laser. The cut line 80 can, but need not necessarily coincide with the first layer edge 24.

Turning next to FIG. 1D, the first area 23 of the substrate 10 and the second area 33 of the micro-wire layer 12 are located in step 225 between the first micro-wires 27 and the second area 33 of the substrate 10 so that the second layer edge 34 extends at least partly beyond the first layer edge 24 and one or more of the second connection pads 38 is located between at least a portion of the first layer edge 24 and the second layer edge 34. Thus, the first area 23 of the substrate 10 and the second area 33 of the micro-wire layer 12 form a vertical stack with the first micro-wires 27 and the second area 33 of the substrate 10 in a direction orthogonal to the substrate 10 surface.

Figure 24:
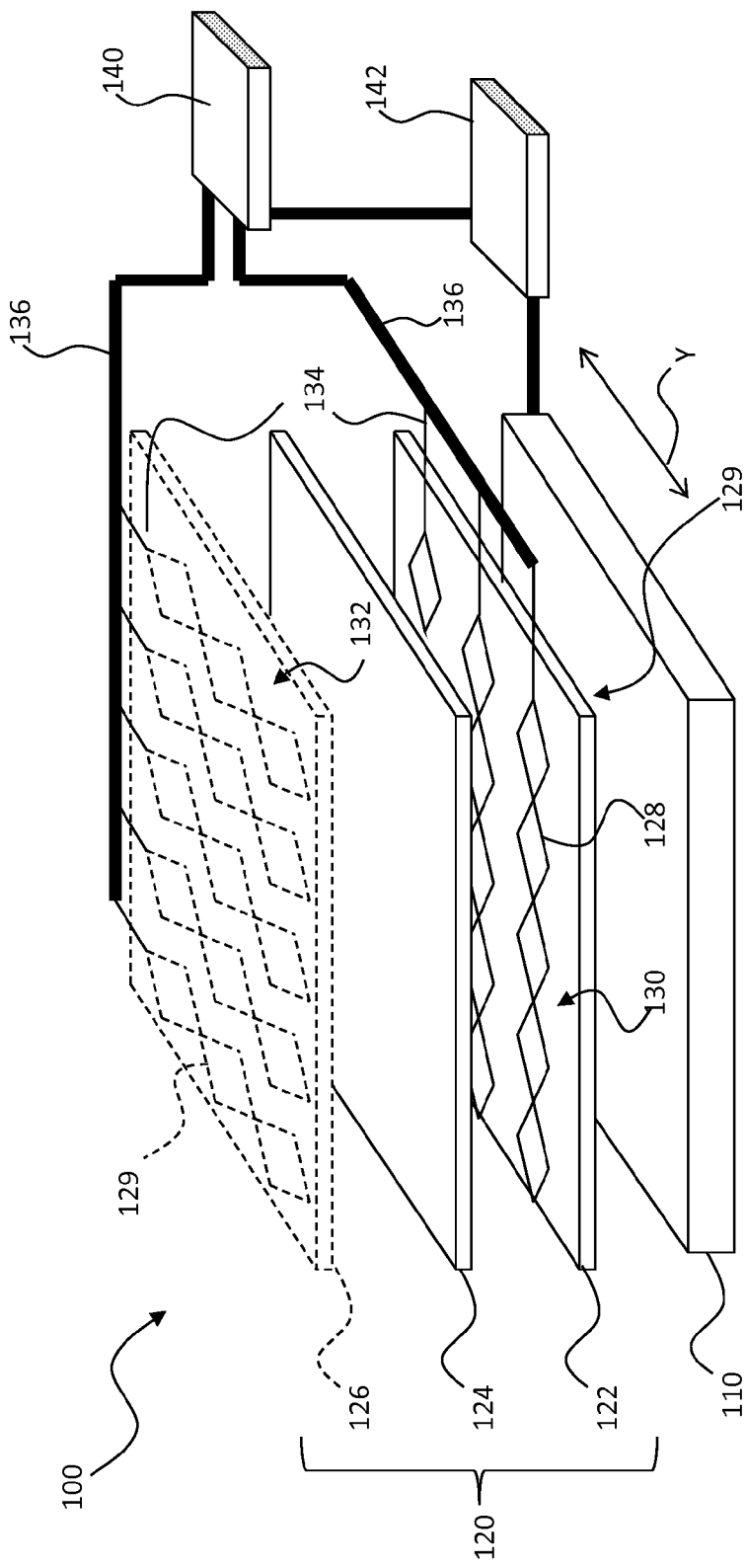
FIG. 24 is a perspective of a touch screen and a display according to the prior art.
Figure 25:
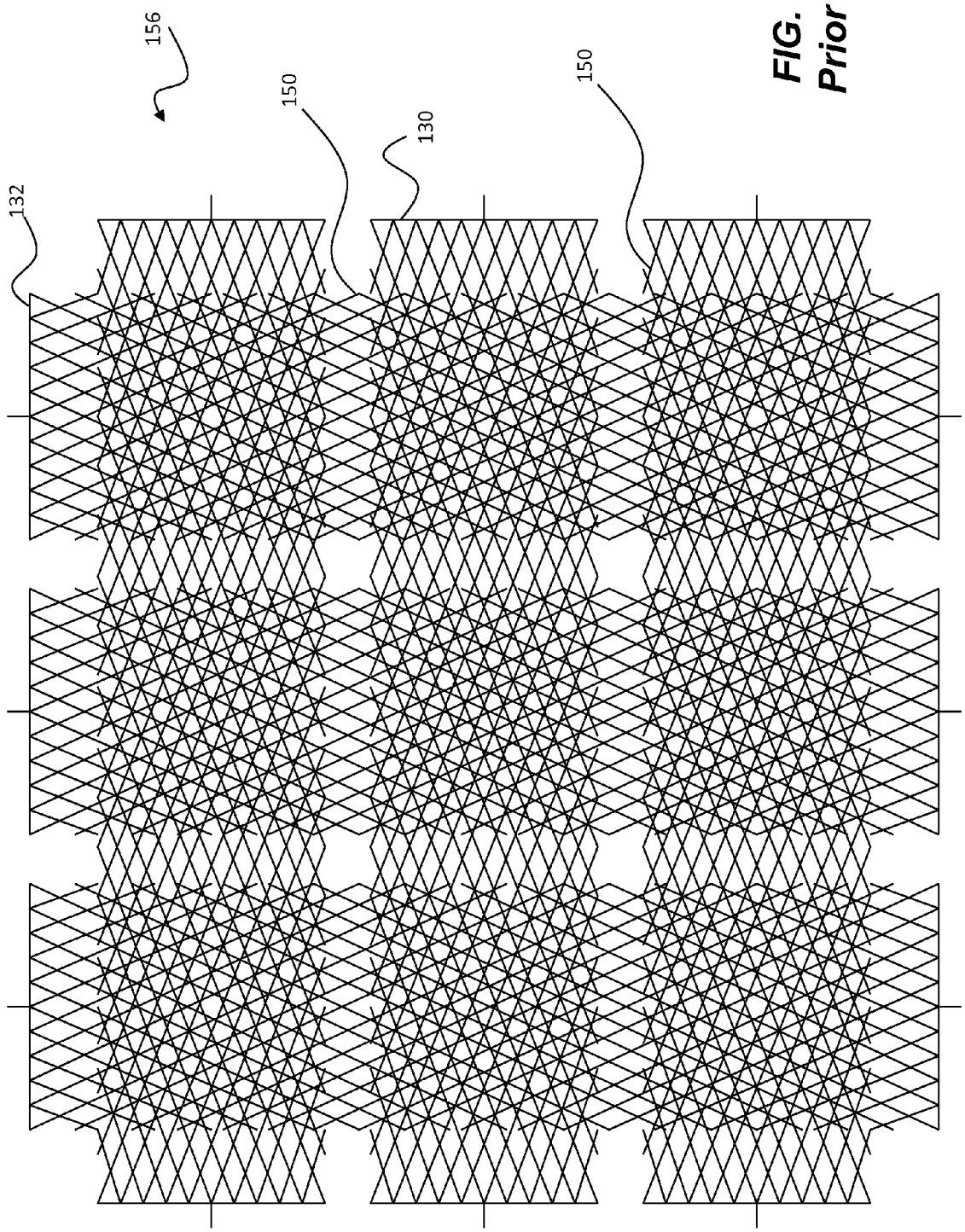
FIG. 25 is a plan view of micro-wire electrodes according to the prior art.

The location step 225 can include a rotation of the first area 23 with respect to the second area 33, for example about an axis perpendicular to a surface of the substrate 10. Alignment marks 18 (FIG. 10) can facilitate locating the first and second areas 23, 33. Alignment marks 18 and ways to align substrates are known in the art. Electrical connectors (not shown in FIG. 1D) are electrically connected in step 410 to the first and second connection pads 28, 38 to enable a controller (e.g. as illustrated in FIG. 24) to electrically control the first and second connection pads 28, 38, for example by providing electrical signals to the second connection pads 38 and receiving electrical signals from the first connection pads 28. Connecting electrical connectors to connection pads is well known in the art.

In another embodiment, an adhesive, for example an optically clear adhesive, is applied to a side of the substrate 10 opposite the micro-wire layer 12 in the first area 23. The second area 33 of the micro-wire layer 12 is then laminated to the side, so that the first and second connection pads 28, 38 are exposed.

As described herein and as indicated in FIG. 1D, after the substrate 10 is separated in step 220, the first area 23 of the substrate 10 is referred to as a first substrate 20 and the second area 33 of the substrate 10 is referred to as a second substrate 30. Likewise, the first area 23 of the micro-wire layer 12 is referred to as a first micro-wire layer 22 and the second area 33 of the micro-wire layer 12 is referred to as a second micro-wire layer 32, as shown in FIG. 1D. The alignment marks 18 in the first area 23 are referred to as first alignment marks 29 and the alignment marks 18 in the second area 33 are referred to as second alignment marks 39, as indicated in FIG. 10 and described further below.

Thus, according to an embodiment of the present invention, a multi-layer micro-wire structure 5 includes the first substrate 20 and the first micro-wire layer 22 in contact with the first substrate 20. The first micro-wire layer 22 extends to the first layer edge 24 and includes one or more first micro-wire electrodes 26 and one or more first connection pads 28. Each first micro-wire electrode 26 includes one or more connected first micro-wires 27 and each first connection pad 28 is electrically connected to a corresponding first micro-wire electrode 26. The second substrate 30 is in contact with the second micro-wire layer 32. The second micro-wire layer 32 extends to the second layer edge 34 and includes one or more second micro-wire electrodes 36 and one or more second connection pads 38. Each second micro-wire electrode 36 includes one or more electrically connected second micro-wires 37 and each second connection pad 38 is electrically connected to a corresponding second micro-wire electrode 36. The second micro-wire layer 32 is located between the first substrate 20 and the second substrate 30 and the second layer edge 34 extends at least partly beyond the first layer edge 24 so that one or more of the second connection pads 38 is located between at least a portion of the first layer edge 24 and the second layer edge 34.

Figure 3:
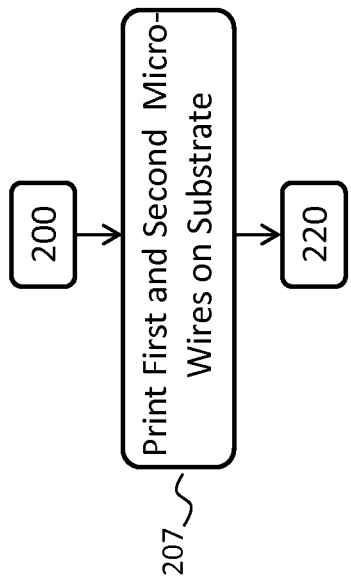
FIGS. 2 and 3 are flow diagrams illustrating methods of the present invention.

Referring to FIG. 3, in an embodiment of the present invention, the first and second micro-wires 27, 37 are located in step 207 by printing conductive material onto the substrate 10 to form the micro-wire layer 12. Printing methods can include inkjet printing, gravure printing, flexographic printing, or screen printing. Any suitable printing method providing the desired conductive material in a desired pattern on the substrate 10 known in the art can be used. For example, the first and second micro-wires 27, 37 are plated micro-wires plated on a printed or deposited seed layer, are silver halide micro-wires formed from one or more exposed silver halide layers, or are dried conductive ink micro-wires. In an embodiment, conductive material is applied in a liquid form and cured (for example by drying) to provide an electrically conductive micro-wire. When in a liquid form, the conductive material is not necessarily electrically conductive. Useful conductive materials are known in the printing arts. In the embodiment, the first micro-wires 27 are located in or on the first micro-wire layer 22 or form the first micro-wire layer 22. Likewise, the second micro-wires 37 are located on the second micro-wire layer 32 or form the second micro-wire layer 32.

Figure 4A:
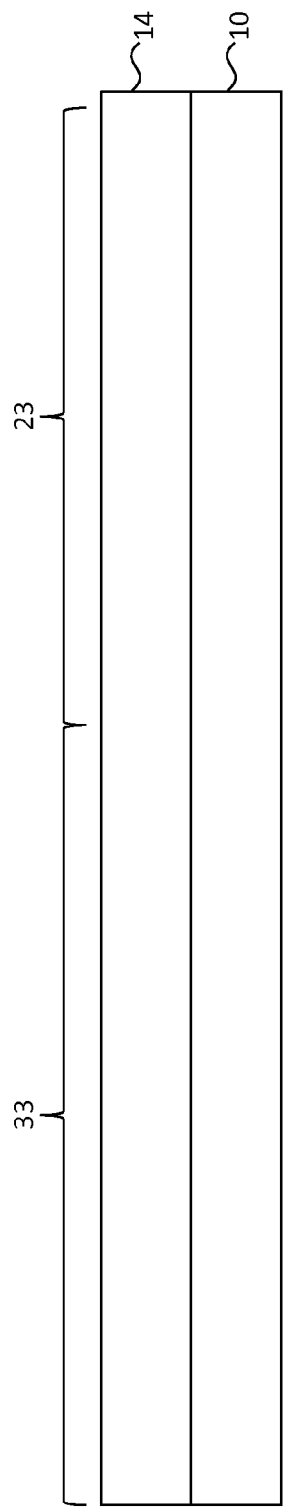
FIGS. 4A-4D are successive cross sections illustrating another method of the present invention.
Figure 4B:
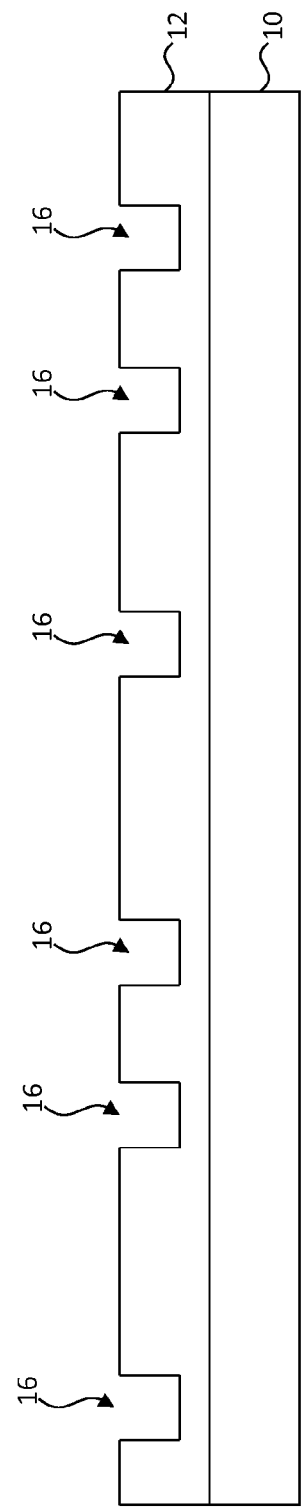

Referring next to the cross sections of FIGS. 4A-4D and to the flow diagram of FIG. 5, an alternative method of locating the micro-wire layer 12 on the substrate 10 is described. The substrate 10 is first provided (in step 200 of FIG. 2) and then coated with a curable layer 14 in step 201 as shown in FIG. 4A, with first and second areas 23, 33. The curable layer 14 is imprinted with micro-channels 16 in step 202 using a stamp to form the micro-channels 16 and radiation or heat to cure the curable layer 14 and the micro-channels 16 to form the micro-wire layer 12 in a cured layer, in step 203 as shown in FIG. 4B. Imprinting methods, curable layer materials, and curing techniques are known in the art.

Figure 4C:
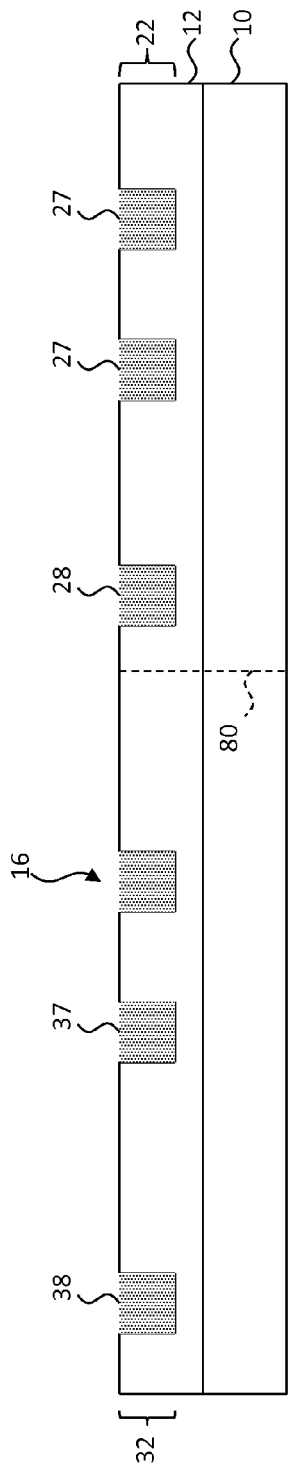

Referring to FIG. 4C, a liquid conductive material is coated over the micro-wire layer 12 surface and the micro-channels 16 in step 204 and removed from the cured micro-wire layer 12 but not the micro-channels 16 in step 205. The liquid conductive material is then cured in step 206 to form the first and second micro-wires 27, 37 in the micro-channels 16. Curing can include heating, exposure to hydrochloric acid, or sintering silver particles. Therefore, in an embodiment the first micro-wires 27 are located in micro-channels 16 formed in the first micro-wire layer 22 or the second micro-wires 37 are located in micro-channels 16 formed in the second micro-wire layer 32. In one embodiment, the first or second micro-wires 27, 37 extend only partially through the first or second micro-wire layers 22, 32, respectively. In the illustration of FIG. 4C, the first and second micro-wires 27, 37, also form the first and second connection pads 28, 38, respectively.

Figure 4D:
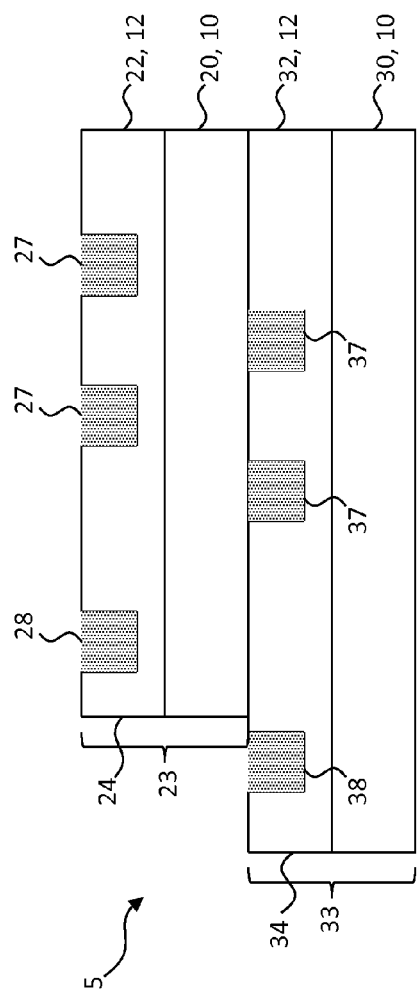

Referring to FIG. 4D and to the step 225 of FIG. 2, the first area 23 of the substrate 10 and the second area 33 of the micro-wire layer 12 are located in step 225 between the first micro-wires 27 in the first area 23 and the second area 33 of the substrate 10 so that the second layer edge 34 extends at least partly beyond the first layer edge 24 and one or more of the second connection pads 38 is located between at least a portion of the first layer edge 24 and the second layer edge 34.

In a further embodiment of the present invention, after locating the first and second areas 23, 33 in step 225 (FIG. 2), the second area 33 of the micro-wire layer 12 is adhered to the first area 23 of the substrate 10 on a side of the substrate 10 opposing the first micro-wires 27, for example by laminating in step 402 of FIG. 6. Alternatively, in the case in which a protective layer 40 is provided (FIG. 1D), after locating the first and second areas 23, 33 in step 225 (FIG. 2), the second area 33 of the protective layer 40 is adhered to the first area 23 of the substrate 10 on a side of the substrate 10 opposing the first micro-wires 27, for example by laminating in step 404 of FIG. 7.

In further embodiments of the present inventions referring to FIGS. 8-9, the multi-layer micro-wire structure 5 (FIG. 4D) is integrated with another substrate, for example a display cover or display substrate. In one embodiment, the first area 23 of the protective layer 40 or the first area 23 of the micro-wire layer 12 is laminated to the other substrate in step 406 of FIG. 8 to adhere the top surface of the multi-layer micro-wire structure 5 (FIG. 4D) to another structure. Alternatively, the second area 33 of the substrate 10 opposite the second area 33 of the micro-wire layer 12 is laminated to the other substrate to adhere the bottom surface of the multi-layer micro-wire structure 5 (FIG. 4D) to another structure. In yet another embodiment, referring to FIG. 9, the second area 33 of the substrate 10 is removed in step 408, for example, by peeling or etching, and the second area 33 of the micro-wire layer 12 is laminated to another substrate in step 409. In an embodiment, the other substrate is a display cover or display substrate so that the second substrate 30 is the substrate or cover of a display device or another device.

Figure 11:
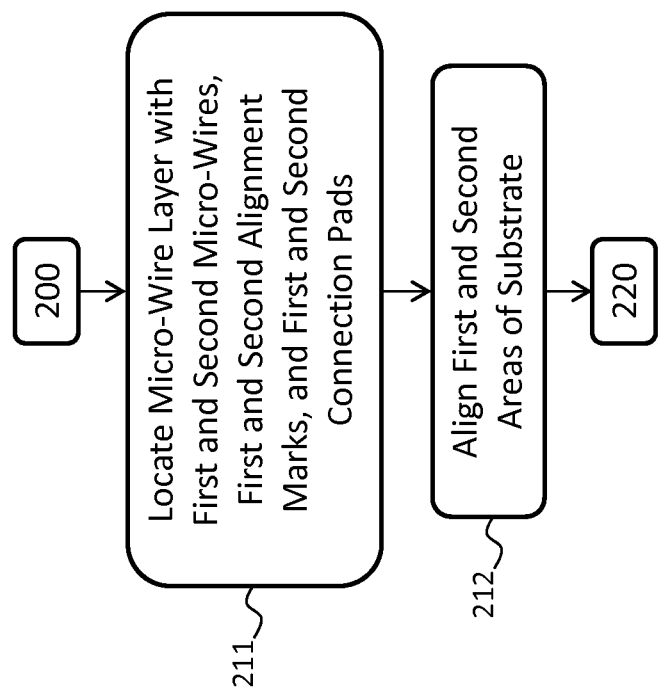
FIG. 11 is a flow diagram illustrating a method of the present invention.

Referring again to FIG. 10 and to FIG. 11, in a further embodiment of the present invention, the alignment marks 18 are located in step 211 on the first area 23 of the substrate 10 or the first area 23 of the micro-wire layer 12. Additional alignment marks are made on the second area 33 of the substrate 10 or the second area 33 of the micro-wire layer 12. In a further embodiment, the alignment marks 18 include the same materials and are made in a common step with the first and second micro-wires 27, 37 or the first and second connection pads 28, 38. Alternatively, the alignment marks 18 are formed in a different step or of different materials.

Once the alignment marks 18 are located in the first and second areas 23, 33, they are used in step 212 to align the first area 23 of the substrate 10 or the first area 23 of the micro-wire layer 12 with the second area 33 of the substrate 10 or the second area 33 of the micro-wire layer 12.

According to various embodiments of the present invention, the first connection pads 28 and the second connection pads 38 are arranged in various configurations with respect to each other, to edges of the substrate 10, or to the first and second layer edges 24, 34. In one embodiment, illustrated in FIG. 10 and in FIG. 12, the first connection pads 28 are located along the first layer edge 24 or the second connection pads 38 are located along the second layer edge 34. In another embodiment, the first alignment mark 29 is located along the first layer edge 24 or the second alignment mark 39 is located along the second layer edge 34.

Figure 12:
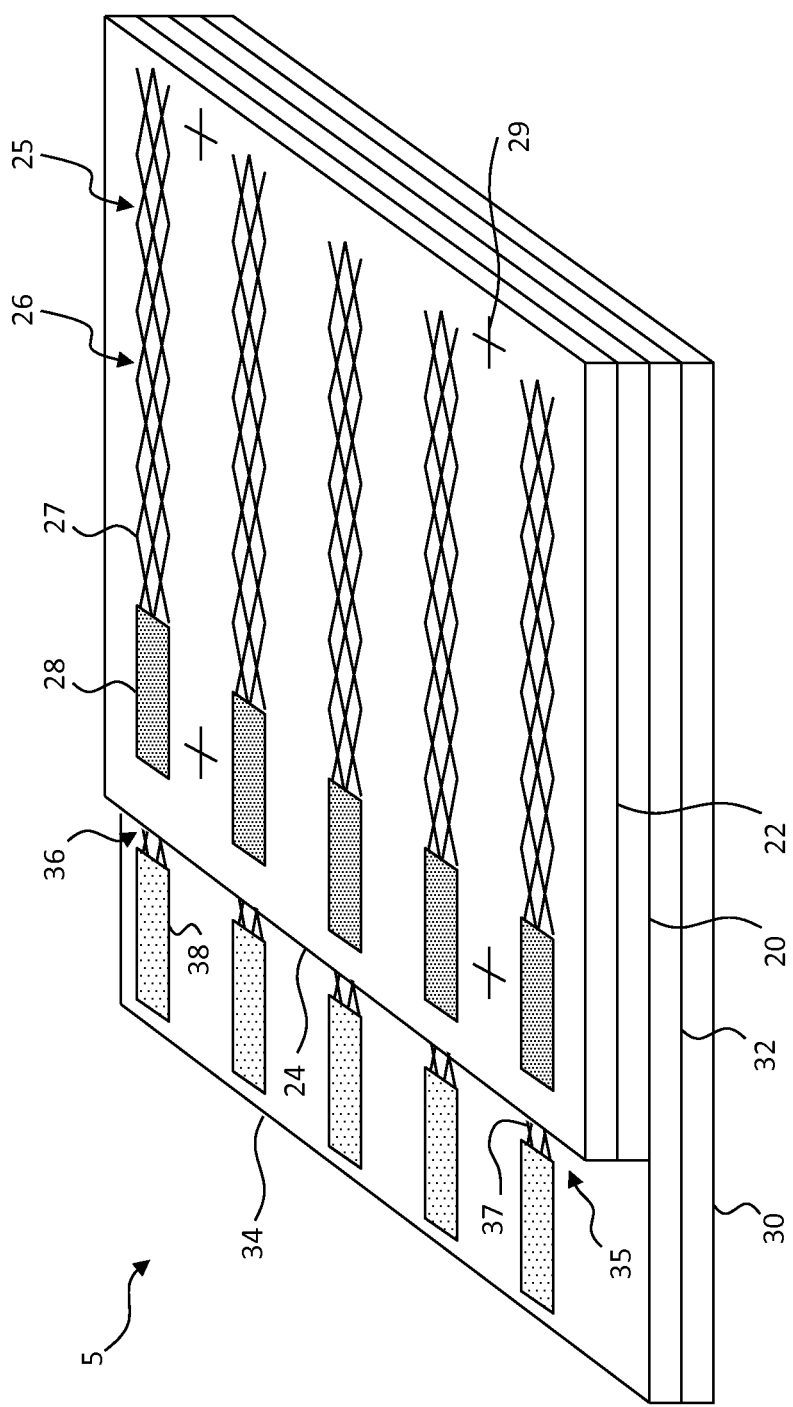
FIG. 12 is a perspective of an embodiment of the present invention.

FIG. 12 further illustrates the multi-layer micro-wire structure 5 including the first substrate 20 and first micro-wire layer 22 in contact with the first substrate 20. The first micro-wire layer 22 extends to the first layer edge 24 and includes one or more first micro-wire electrodes 26 and one or more first connection pads 28. Each first micro-wire electrode 26 includes one or more electrically connected first micro-wires 27 and each first connection pad 28 electrically connects to a corresponding first micro-wire electrode 26. A second substrate 30 is in contact with the second micro-wire layer 32. The second micro-wire layer 32 extends to the second layer edge 34 and includes one or more second micro-wire electrodes 36 and one or more second connection pads 38. Each second micro-wire electrode 36 includes one or more electrically connected second micro-wires 37 and each second connection pad 38 electrically connects to a corresponding second micro-wire electrode 36. The second micro-wire layer 32 is located between the first substrate 20 and the second substrate 30 and the second layer edge 34 extends at least partly beyond the first layer edge 24 so that one or more of the second connection pads 38 is located between at least a portion of the first layer edge 24 and the second layer edge 34.

In various embodiments of the present invention, first substrate 20 and the second substrate 30 include common materials and have a common thickness. In such an embodiment, the first substrate 20 and the second substrate 30 are separated from the common substrate 10.

Figure 13:
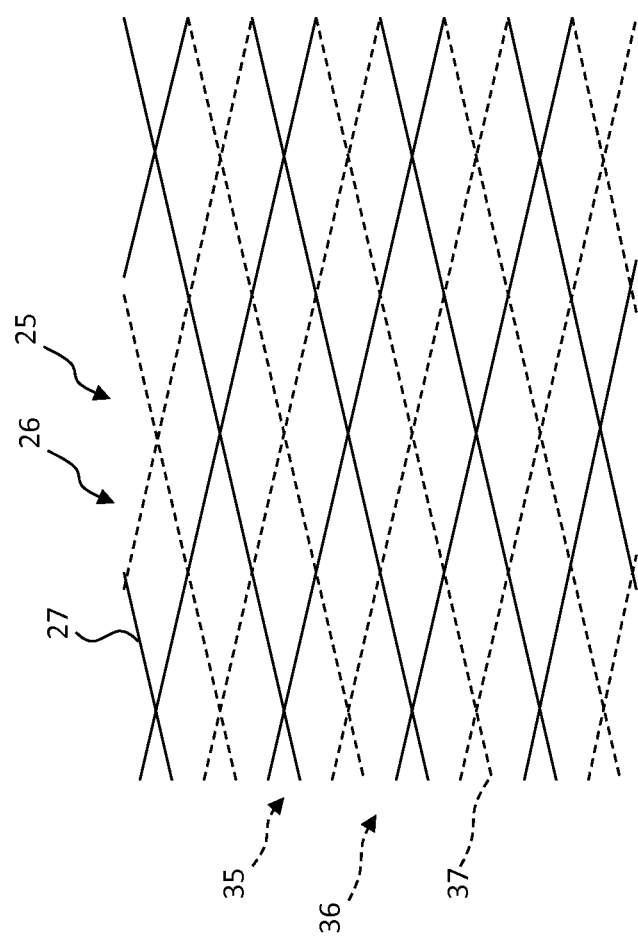
FIG. 13 is a plan view of first and second micro-wire patterns useful in understanding embodiments of the present invention.

Referring again to FIGS. 10 and 12, the first micro-wires 27 are arranged in a first pattern 25 and the second micro-wires 37 are arranged in a second pattern 35. In an embodiment, the second pattern 35 is the same as the first pattern 25. In a further embodiment, the second pattern 35 is spatially out of phase with the first pattern 25 in a direction D parallel to a surface of the first substrate 20. Referring further to the plan view of FIG. 13, the first pattern 25 is shown with the first micro-wires 27 of the first micro-wire electrode 26 indicated in solid lines and the second pattern 35 is shown with the second micro-wires 37 of the second electrode 36 indicated in dashed lines. The first and second patterns 25, 35 in FIG. 13 are the same except that the second pattern 35 is spatially out of phase with the first pattern 25 by 180 degrees.

According to methods and structures of the present invention, the first and second micro-wire electrodes 26, 36 and the first and second micro-wires 27, 37 are formed in a common step of common materials on a common substrate 10 in first and second distinct and separated areas 23, 33, are separated into separate first and second substrates 20, 30, and located to overlap the first and second micro-wire electrodes 26, 36 to form a capacitive touch screen. In an embodiment (FIG. 1D), the bottom side of the second substrate 30 opposite the second micro-wires 37 provides a touch surface 42 of a capacitive touch screen. Alternatively, the protective layer 40 located on a side of the first micro-wires 27 opposite the first substrate 20 has a touch surface 41 located on a side of the protective layer 40 opposite the first micro-wires 27.

Figure 14:
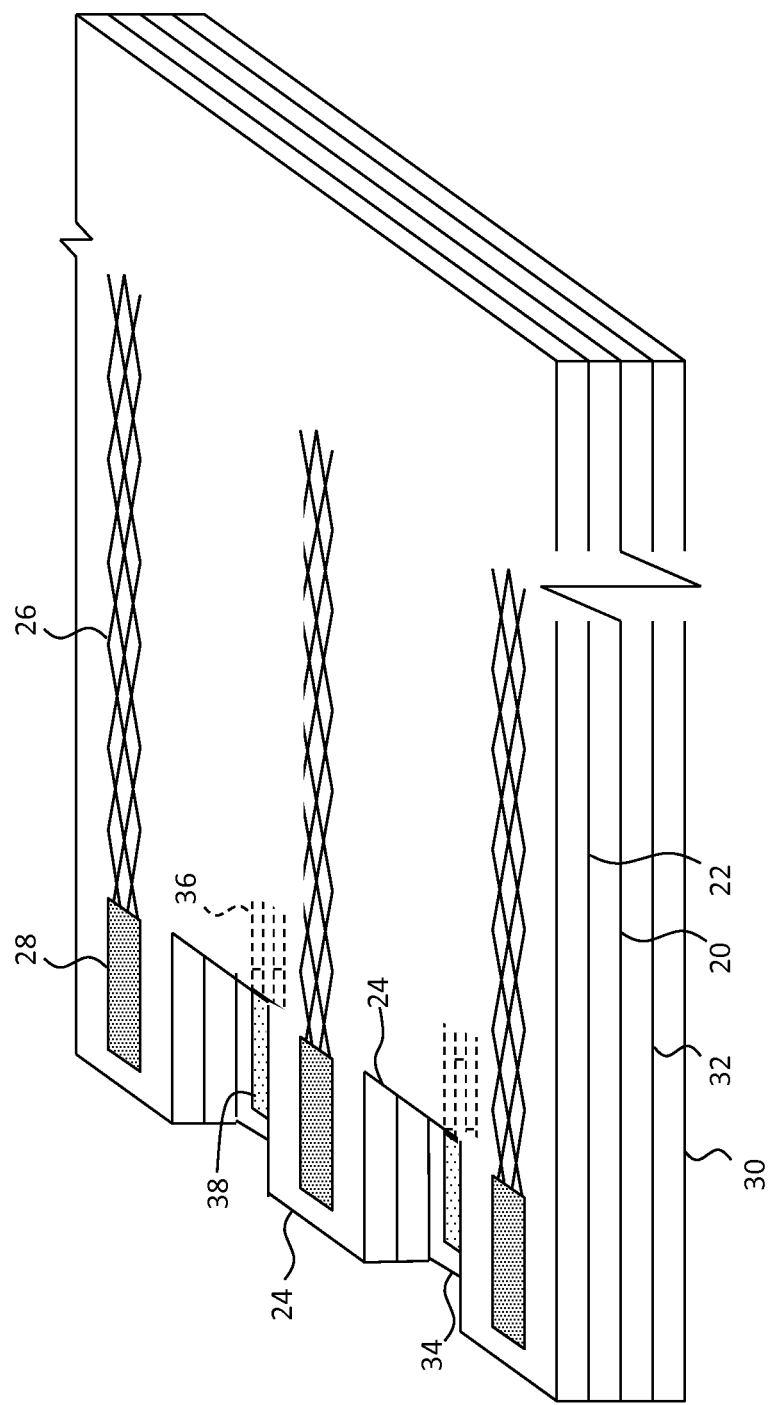
FIGS. 14-19 are perspectives of various embodiments of the present invention.

In the embodiment of FIGS. 10 and 12, the first and second connection pads 28, 38 are arranged in separate parallel rows and the first and second layer edges 24, 34 each coincide with an edge of the first or second substrate 20, 30 respectively. In an alternative embodiment, illustrated in FIG. 14, the first and second connection pads 28, 38 are arranged in a common row. Referring to FIG. 14, the first connection pads 28 and the first micro-wire electrodes 26 are located on or in the first substrate 20 or the first micro-wire layer 22. The second connection pads 38 and the second micro-wire electrodes 36 are located on or in the second substrate 30 or the second micro-wire layer 32 in alignment with the first connection pads 28 and the first micro-wire electrodes 26. The first layer edge 24 is crenellated so that some portions coincide with the second layer edge 34 but other portions do not. Thus, in this embodiment, only portions of the second layer edge 34 extend beyond the first layer edge 24 so that the second connection pads 38 are located between portions of the first layer edge 24 and the second layer edge 34.

Figure 15:
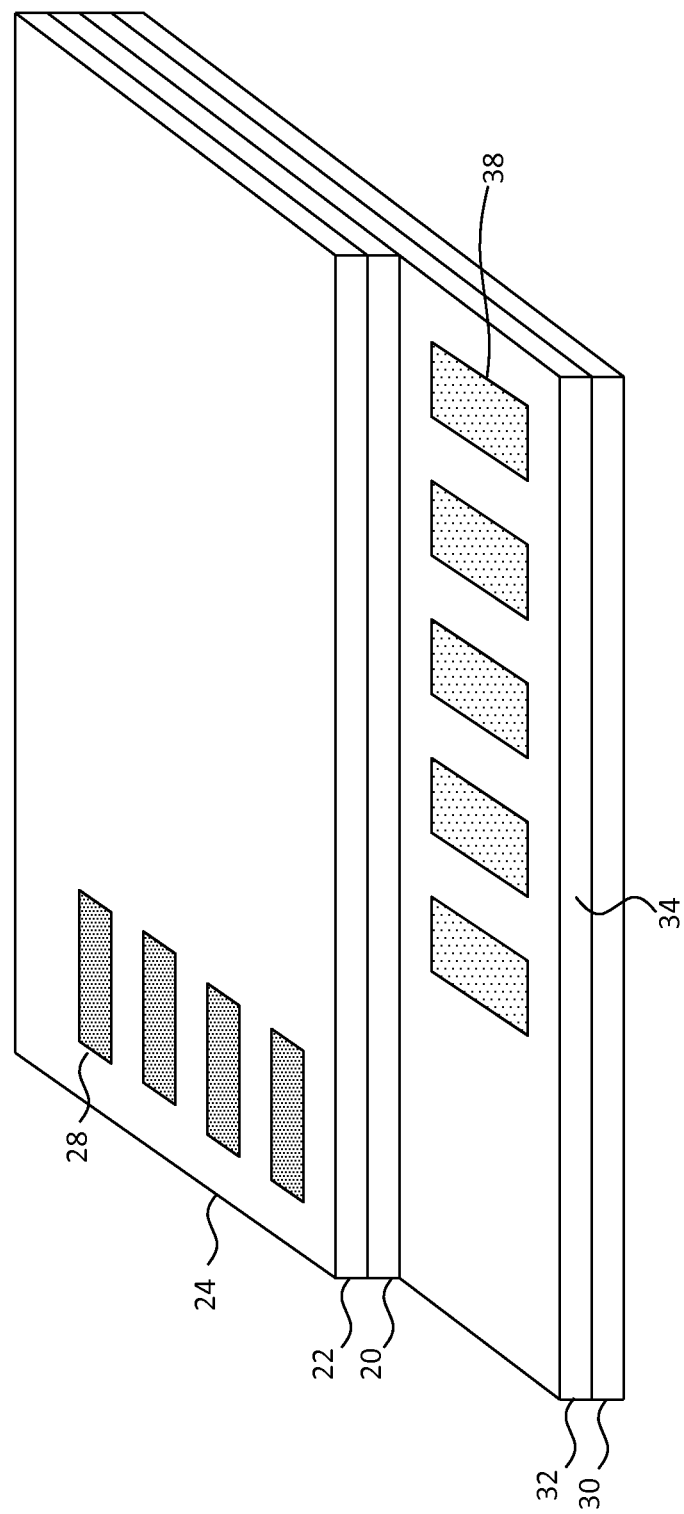
Figure 16:
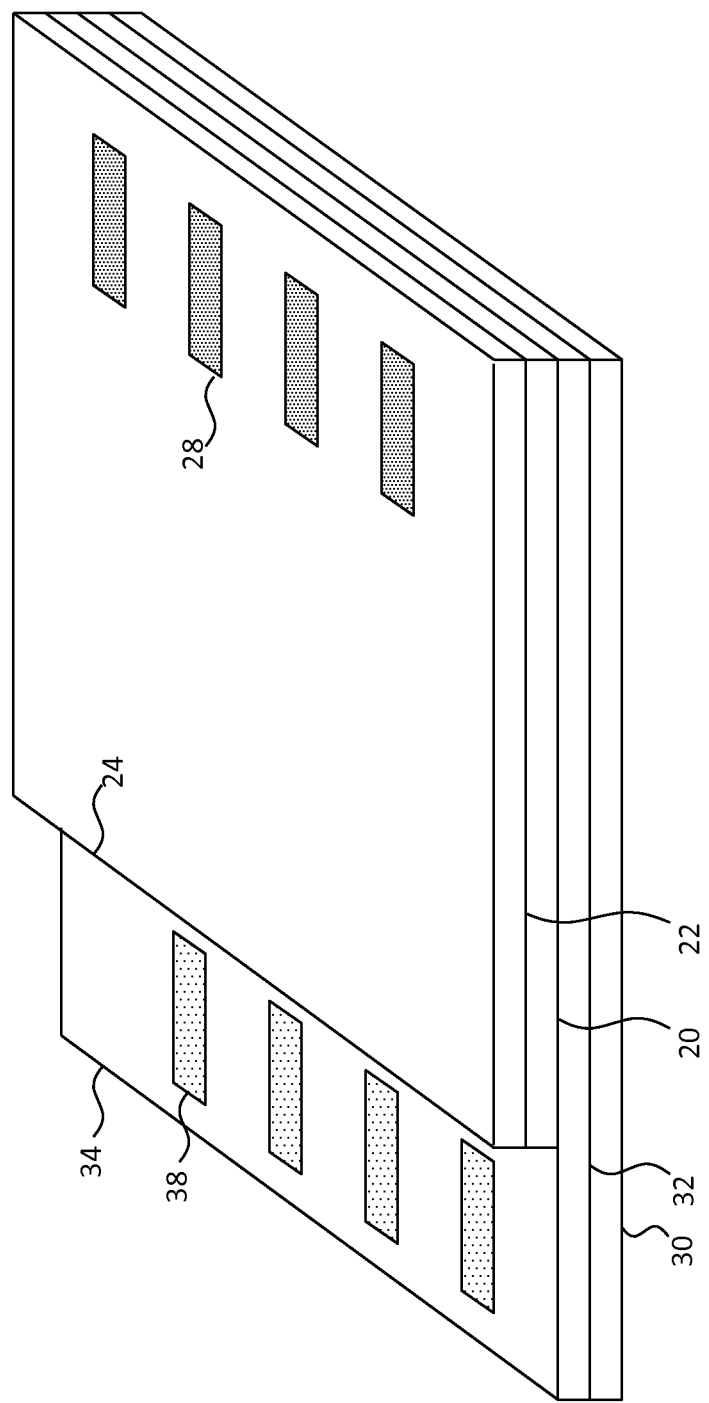

In yet another embodiment, referring to FIG. 15, the first layer edge 24 of the first micro-wire layer 22 is orthogonal to the second layer edge 34 of the second micro-wire layer 32. The first connection pads 28 are arranged adjacent to the first layer edge 24 and the second connection pads 38 are arranged adjacent to the second layer edge 34. In the embodiment of FIG. 16, the first substrate 20 has an edge different from and parallel to the first layer edge 24 of the first micro-wire layer 22 and the first connection pads 28 are arranged along and adjacent to the different substrate edge. The second connection pads 38 are arranged along the second layer edge 34 of the second micro-wire layer 32. Alternatively (not shown), the second substrate 30 has an edge different from and parallel to the second layer edge 34 and the second connection pads 38 are arranged along and adjacent to the different substrate edge.

Figure 17:
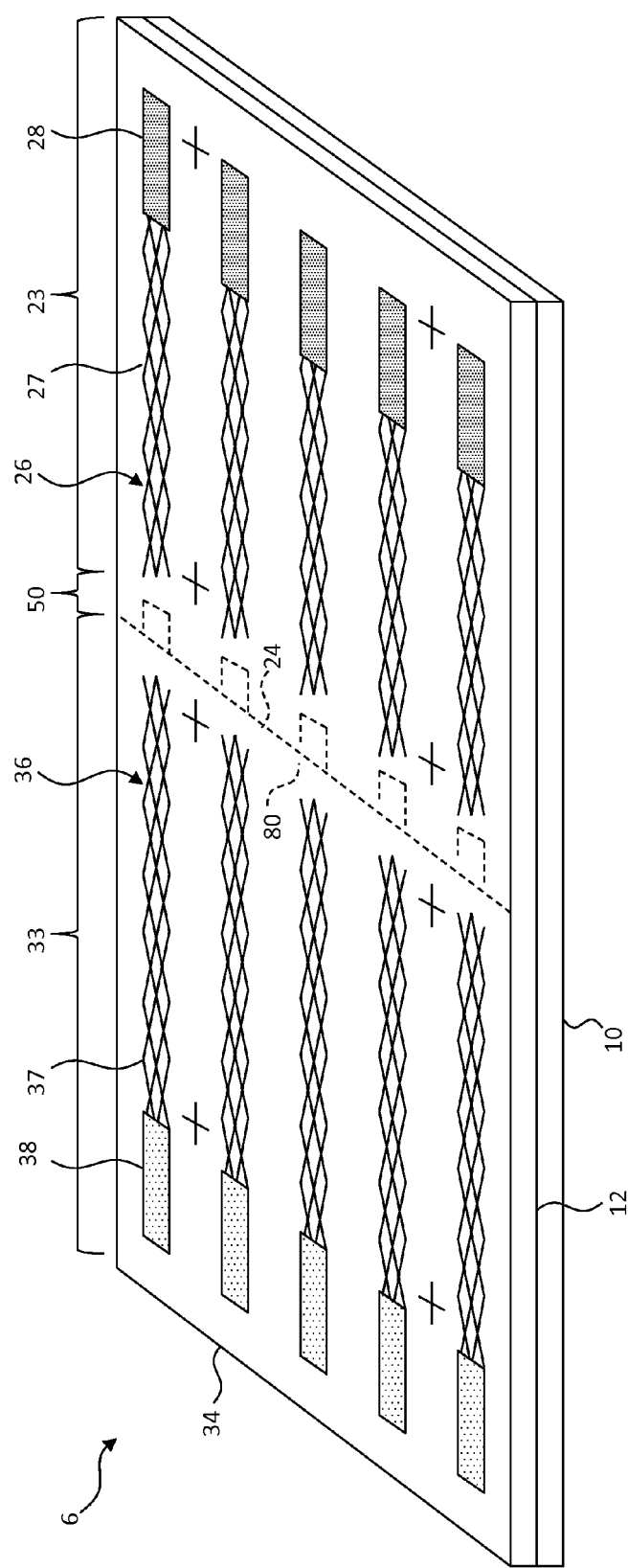

The various arrangements of first and second connection pads 28, 38 in various embodiments of the present invention are enabled by a corresponding variety of multi-area micro-wire structures 6. In the embodiment of FIG. 10, the second micro-wires 27 are located between the first connection pads 28 and the second connection pads 38. The first connection pads 28 and the second connection pads 38 are arranged in separate rows. Such an arrangement is useful in forming the multi-layer micro-wire structures 5 illustrated in FIGS. 1D, 4D, 12 and 14. Referring to FIG. 17, in another embodiment, the first micro-wires 27 and the second micro-wires 37 are located between the first connection pads 28 and the second connection pads 38. The first and second areas 23, 33 are separated by a spacing area 55 that can enable cut lines 80 that are not straight, for example crenellated, as shown. The first layer edge 24 can coincide with the edge of the spacing area 50. The second layer edge 34 coincides with an edge of the substrate 10. First and second micro-wire electrodes 26, 36 are located on the micro-wire layer 12 on the substrate 10. In another embodiment, the substrate 10 is further trimmed to provide a desired shape, for example to align layer edges with substrate edges.

Figure 18:
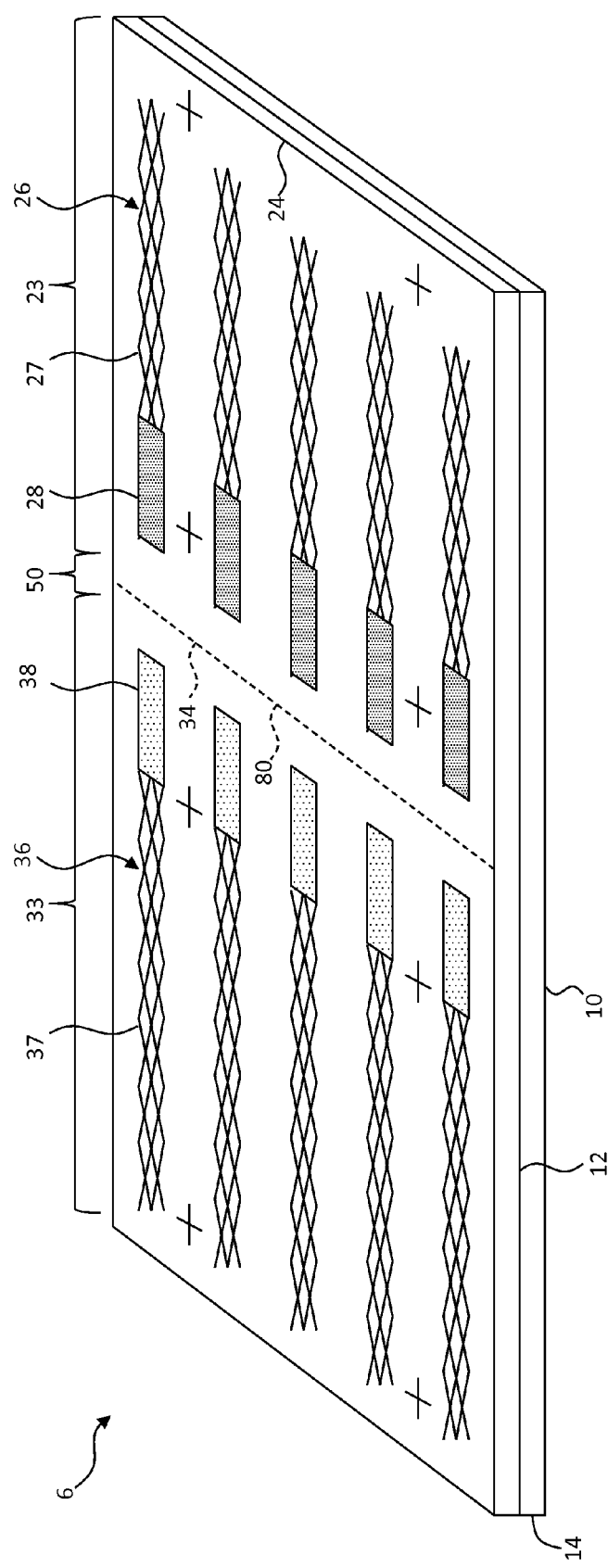
Figure 19:
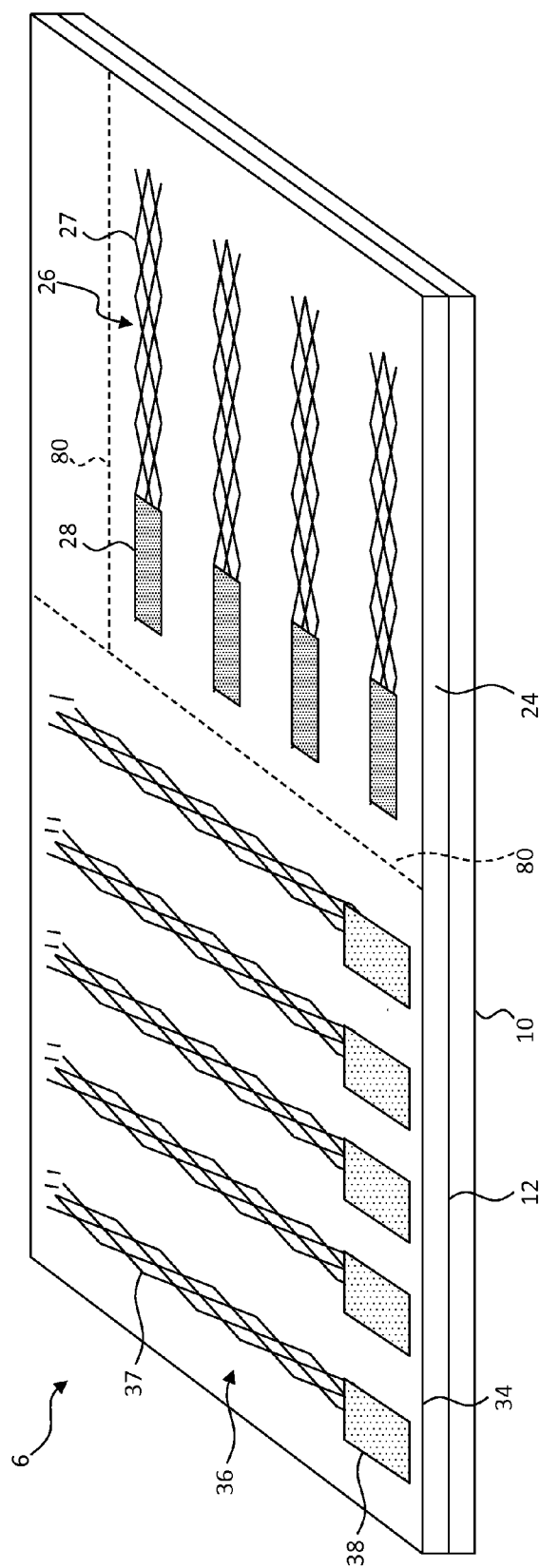

Referring to FIG. 18, in yet another embodiment, the first connection pads 28 and the second connection pads 38 are both located between both the first micro-wires 27 and the second micro-wires 37. The spacing area 50 includes a straight cut line 80. The first layer edge 24 can coincide with the edge of the spacing area 50. The second layer edge 34 coincides with the edge of the substrate 10. The first and second micro-wire electrodes 26, 36 are located on the micro-wire layer 12 on the substrate 10. In one embodiment of the present invention, the first and second substrates 20, 30 are aligned without relative rotation in step 225 of FIG. 2. In another embodiment, the first and second substrates 20, 30 are relatively rotated in step 225 of FIG. 2 to form the structure illustrated in FIG. 15, in which the rows of first and second connection pads 28, 38 are orthogonal to each other in a plane having an orthogonal to the surface of the first or second substrates 20, 30. Alternatively, the first and second connection pads 28, 38 are located orthogonally to each other on the substrate 10 and the micro-wire layer 12, as shown in FIG. 19, so that the arrangement of FIG. 15 is made without relative rotation between the first and the second substrates 20, 30. As shown in FIG. 19, the first and the second micro-wire electrodes 26, 36 on the micro-wire layer 12 and the substrate 10 extend orthogonally to rows of the first and the second connection pads 28, 38.

Figure 20:
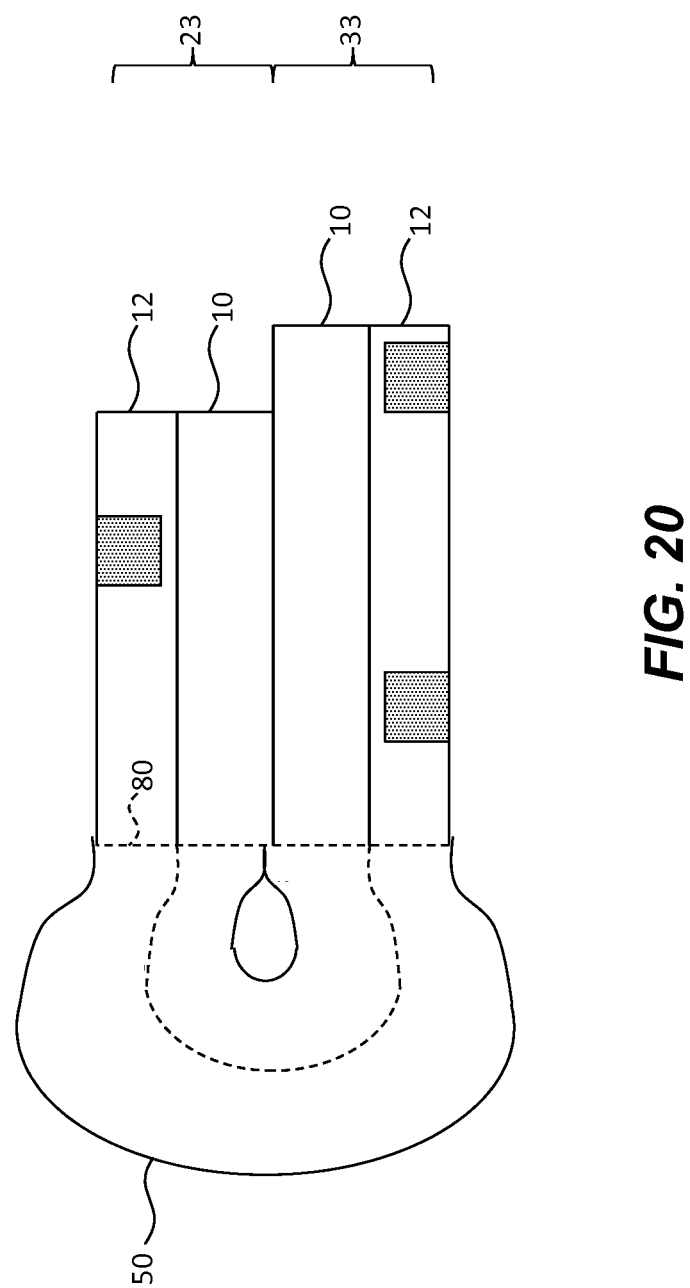
FIG. 20 is a cross section of an embodiment of the present invention.

Referring to FIG. 20, according to another method and embodiment of the present invention, the substrate 10 and the micro-wire layer 12 are folded in the spacing area 50 so that the substrate 10 is between the first area and the second areas 23, 33 of the micro-wire layer 12. In an embodiment the folded spacing portion 50 is cut away by cutting along cut line 80.

The multi-layer micro-wire structure 5 and multi-area micro-wire structure 6 of the present invention is useful in a capacitive touch screen. In such an embodiment, the first micro-wires 27 are sense micro-wires and the second micro-wires 37 are drive micro-wires. Alternatively, the second micro-wires 37 are sense micro-wires and the first micro-wires 27 are drive micro-wires. The control and operation of capacitive touch screens is well known in the touch screen art.

To form the capacitors in a capacitive touch screen, it is useful to provide overlapping electrodes that extend in orthogonal directions. For simplicity in illustration, the first and second micro-wire electrodes 26, 36 of FIGS. 10, 12, 14, and 17-19 are shown as extending in the same direction. The first micro-wire electrodes 26 can be rotated with respect to the second micro-wire electrodes 36 in step 225 (FIG. 2) to provide overlapping orthogonal first and second micro-wire electrodes 26, 36. In a useful alternative embodiment of the present invention, the first micro-wire electrodes 26 extend over the first substrate 20 in a direction orthogonal to the direction in which the second micro-wire electrodes 36 extend over the second substrate 30. FIG. 15 illustrates a row of first connection pads 28 that is arranged orthogonally to the row of second connection pads 38. First and second micro-wire electrodes 26, 36 (not shown) extending from the first and second connection pads 28, 38, respectively will extend in orthogonal direction, will overlap, and will form capacitors when properly controlled with electrical signals.

Figure 21:
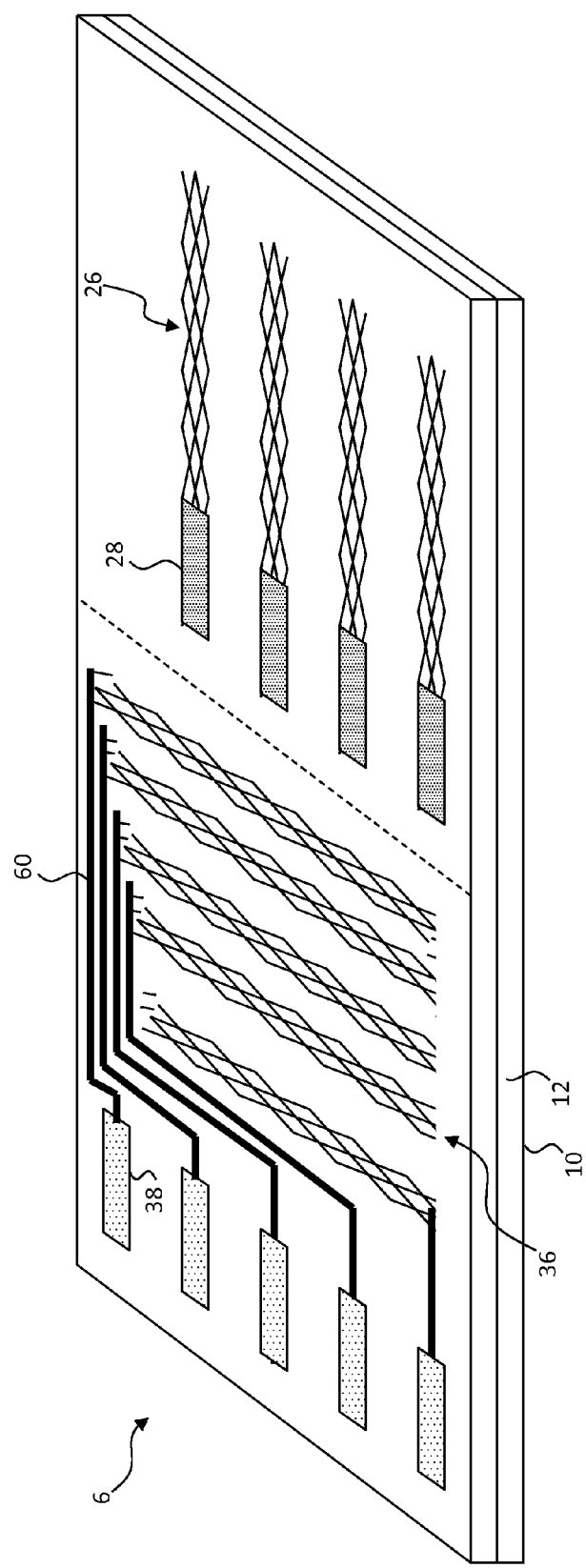
FIG. 21 is a perspective of an embodiment of the present invention.
Figure 22:
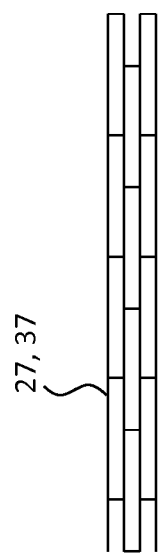
FIG. 22 is a plan view of micro-wires useful in understanding embodiments of the present invention.

Referring to FIG. 21, the multi-area micro-wire structure 6 formed on the substrate 10 and the micro-wire layer 12 includes parallel rows of first and second connection pads 28, 38 that are electrically connected to the first and second micro-wire electrodes 26, 36, respectively. The first and second micro-wire electrodes 26, 36 are orthogonal and, when the substrate 10 and the micro-wire layer 12 are separated and located as described in steps 220 and 225 of FIG. 2, form the multi-layer micro-wire structure 5 shown in FIG. 12 and overlap to form capacitors useful in a capacitive touch screen. In an embodiment, the first and second micro-wire electrodes 26, 36 are electrically connected by bus lines 60 to the first and second connection pads 28, 38 (shown only for the second connection pads 38). In an embodiment, the bus lines 60 are formed of common materials in a common step with the first or second micro-wires 27, 37, as shown in FIG. 22.

Figure 23:
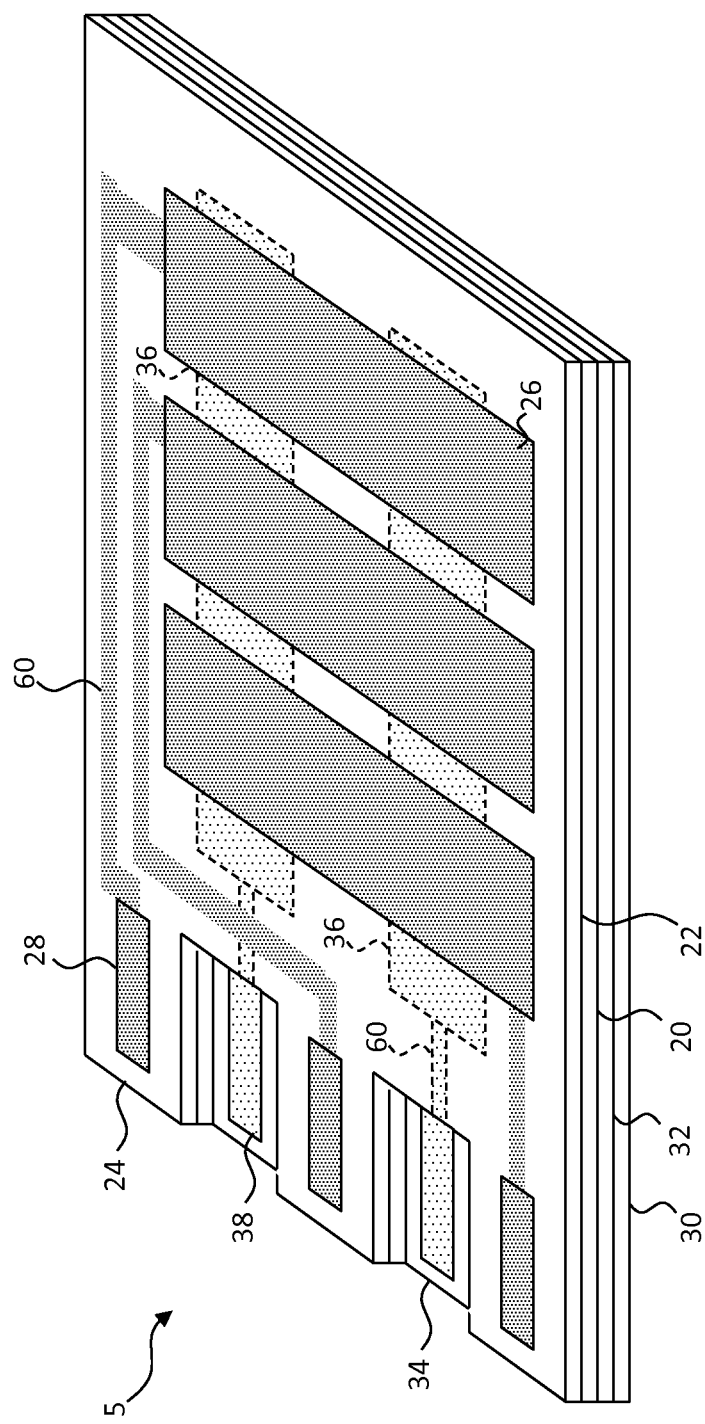
FIG. 23 is a perspective of an embodiment of the present invention.

FIG. 23 illustrates another embodiment of the multi-layer micro-wire structure 5. As shown in FIG. 23, the first and second substrates 20, 30 support first and second micro-wire layers 22, 32 on which are formed orthogonally oriented first and second micro-wire electrodes 26, 36 electrically connected by bus lines 60 to first and second connection pads 28 38. The first layer edge 24 is crenellated and the second layer edge 34 coincides with an edge of the second substrate 30.

The various edge structures and the first and the second connection pad 28, 38 arrangements illustrated are useful for enabling various electrical interconnections with electrical cables (for example ribbon cables) external to the substrate 10 and structures formed thereon. In embodiments having the first and the second connection pads 28, 38 arranged in a single row, a single row of connection points in, for example, a ribbon cable is affixed to the first and the second connection pads 28, 38 (e.g. as in FIG. 14). In embodiments having the first and the second connection pads 28, 38 arranged in separate rows, a double row of connection wires are affixed to the first and the second connection pads 28, 38 (e.g. as in FIG. 12). In embodiments having the first and the second connection pads 28, 38 arranged along separate substrate edges, separate cables are electrically connected to the separate rows of first and second connection pads 28, 38 (e.g. as in FIG. 15). The first and second connection pads 28, 38 arranged in separate parallel rows can be spatially offset from each other, or aligned together.

The micro-wire layer 12 (the first or second micro-wire layers 22, 32) useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated. When a molding device, such as an imprinting stamp having an inverse micro-channel structure is applied to liquid curable material coated on the substrate 10 and the cross-linking agents in the curable material are activated, the liquid curable material in the curable layer 14 is hardened into a cured micro-wire layer 12 with the imprinted micro-channels 16. The liquid curable materials can include a surfactant to assist in controlling coating on the substrate 10. Materials, tools, and methods are known for imprinting coated liquid curable materials to form cured layers having the micro-channels 16.

Curable inks useful in the present invention are known and can include conductive inks having metal particles, for example electrically conductive nano-particles. The electrically conductive nano-particles can be metallic or have an electrically conductive shell. The electrically conductive nano-particles can be silver, can be a silver alloy, or can include silver or other metals, such as tin, tantalum, titanium, gold, copper, or aluminum, or alloys thereof. The metal particles can be sintered to form a metallic electrical conductor. Cured inks can include light-absorbing materials such as carbon black, a dye, or a pigment.

Curable inks provided in a liquid form are deposited or located in the micro-channels 16. Once deposited, the conductive inks are cured, for example by heating or exposure to radiation such as infra-red, visible light, or ultra-violet radiation. The curing process drives out the liquid carrier and sinters the metal particles to form a metallic electrical conductor. The curable ink hardens to form the cured ink that makes up the first or the second micro-wires 27, 37. For example, a curable conductive ink with conductive nano-particles is located by coating the micro-wire layer 12 to fill the micro-channels 16 and heated to agglomerate or sinter the nano-particles, thereby forming electrically conductive first and second micro-wires 27, 37. Materials, tools, and methods are known for coating liquid curable inks to form the first and the second micro-wires 27, 37 in the micro-channels 16.

In an embodiment, a curable ink can include conductive nano-particles in a liquid carrier (for example an aqueous solution including surfactants that reduce flocculation of metal particles, humectants, thickeners, adhesives or other active chemicals). The liquid carrier is located in micro-channels 16 and heated or dried to remove liquid carrier or treated with hydrochloric acid, leaving a porous assemblage of conductive particles that are agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

According to various embodiments of the present invention, the substrate 10 is any material having a surface on which a cured micro-wire layer 12 is formed or on which patterned first or second micro-wires 27, 37 can be printed, deposited, or plated. The substrate 10 can be a rigid or a flexible substrate made of, for example, a glass, metal, plastic, or polymer material, can be transparent, and can have opposing substantially parallel and extensive surfaces. The substrates 10 can include a dielectric material useful for capacitive touch screens and can have a wide variety of thicknesses, for example 10 microns, 50 microns, 100 microns, 1 mm, or more. In various embodiments of the present invention, the substrate 10 is provided as a separate structure or is coated on another underlying substrate, for example by coating a polymer substrate layer on an underlying glass substrate.

The substrate 10 can be an element of other devices, for example the cover or substrate of a display or a substrate, cover, or dielectric layer of a touch screen. In an embodiment, the substrate 10 of the present invention is large enough for a user to directly interact therewith, for example using an implement such as a stylus or using a finger or hand. Methods are known in the art for providing suitable surfaces on which to coat a single curable layer. In a useful embodiment, the substrate 10 is substantially transparent, for example having a transparency of greater than 90%, 80% 70% or 50% in the visible range of electromagnetic radiation.

The micro-channel 16 is a groove, trench, or channel formed on or in the substrate 10 and can have a cross-sectional width less than 20 microns, for example 10 microns, 5 microns, 4 microns, 3 microns, 2 microns, 1 micron, or 0.5 microns, or less. Micro-channels 16 can have a rectangular cross section, as shown. Other cross-sectional shapes, for example trapezoids, are known and are included in the present invention. The width or depth of a layer is measured in cross section.

In various embodiments of the present invention, the micro-channel 16 or the first or the second micro-wire 27, 37 has a width less than or equal to 10 microns, 5 microns, 4 microns, 3 microns, 2 microns, or 1 micron. In an example and non-limiting embodiment of the present invention, each first or second micro-wire 27, 37 is from 10 to 15 microns wide, from 5 to 10 microns wide, or from 5 microns to one micron wide. In some embodiments, the first or second micro-wires 27, 37 can fill the micro-channel 16; in other embodiments the first or second micro-wires 27, 37 do not fill the micro-channel 16. In an embodiment, the first or the second micro-wire 27, 37 is solid; in another embodiment the first or the second micro-wire 27, 37 is porous.

Electrically conductive micro-wires, for example the first micro-wires 27 and the second micro-wires 37, and methods of the present invention are useful for making electrical conductors and busses for transparent micro-wire electrodes and electrical conductors in general, for example as used in electrical busses 60. A variety of micro-patterns can be used and the present invention is not limited to any one pattern. Micro-wires can be spaced apart, form separate electrical conductors, or intersect to form a mesh electrical conductor on or in the substrate 10 or the first or the second micro-wire layers 22, 32. The micro-channels 16 can be identical or have different sizes, aspect ratios, or shapes. Similarly, micro-wires can be identical or have different sizes, aspect ratios, or shapes. The micro-wires can be straight or curved.

Micro-wires can be metal, for example silver, gold, aluminum, nickel, tungsten, titanium, tin, or copper or various metal alloys including, for example silver, gold, aluminum, nickel, tungsten, titanium, tin, or copper. Micro-wires can include a thin metal layer composed of highly conductive metals such as gold, silver, copper, or aluminum. Other conductive metals or materials can be used. Alternatively, micro-wires can include cured or sintered metal particles such as nickel, tungsten, silver, gold, titanium, or tin or alloys such as nickel, tungsten, silver, gold, titanium, or tin. Conductive inks can be used to form micro-wires with pattern-wise deposition or pattern-wise formation followed by curing steps. Other materials or methods for forming micro-wires, such as curable ink powders including metallic nano-particles, can be employed and are included in the present invention.

Electrically conductive micro-wires of the present invention can be operated by electrically connecting micro-wires through first or second connection pads 28, 38 and electrical connectors to electrical circuits that provide electrical current to the micro-wires and can control the electrical behavior of the micro-wires. Electrically conductive micro-wires of the present invention are useful, for example in touch screens such as projected-capacitive touch screens that use transparent micro-wire electrodes and in displays. Electrically conductive micro-wires can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D direction
X x dimension
Y y dimension
5 multi-layer micro-wire structure
6 multi-area micro-wire structure
10 substrate 12 micro-wire layer
14 curable layer
16 micro-channels
18 alignment marks
20 first substrate
22 first micro-wire layer
23 first area
24 first layer edge
25 first pattern
26 first micro-wire electrode
27 first micro-wire
28 first connection pad
29 first alignment mark
30 second substrate
32 second micro-wire layer
33 second area
34 second layer edge
35 second pattern
36 second micro-wire electrode
37 second micro-wire
38 second connection pad
39 second alignment mark
40 protective layer
41 touch surface
42 touch surface
50 spacing area
60 bus line
80 cut line
100 display and touch screen system
110 display
120 touch screen
122 first transparent substrate
124 dielectric layer
126 second transparent substrate
128 first pad area
129 second pad area
130 first transparent electrode
132 second transparent electrode
134 wires
136 electrical buss connections
140 touch-screen controller
142 display controller
150 micro-wire
156 micro-pattern
200 provide substrate step
201 form curable layer step
202 imprint micro-channel(s) step
203 cure curable layer and micro-channel(s) step
204 deposit conductive ink on cured layer and in micro-channel(s) step
205 remove conductive ink from cured layer step
206 cure conductive ink in micro-channel(s) step
207 print first and second micro-wires on substrate step
210 locate micro-wire layer with first and second micro-wires step
211 locate first and second micro-wires, connection pads, and alignment marks step
212 align first and second areas of substrate step
220 separate first and second areas step
225 locate second area in alignment with first area step
400 locate protective layer step
402 laminate second area of micro-wire layer to first area of substrate step
404 laminate second area of protective layer to first area of substrate step
406 laminate first area of protective layer to second substrate step
408 remove second area of substrate step
409 laminate second area of micro-wire layer to second substrate step
410 affix connector step

The invention claimed is:

1. A multi-layer micro-wire structure, comprising:
a first substrate and a first layer in contact with the first substrate, the first layer extending to a first layer edge and including one or more first micro-wire electrodes and one or more first connection pads, each first micro-wire electrode including one or more electrically connected first micro-wires, and each first connection pad electrically connected to a corresponding first micro-wire electrode;
a second substrate and a second layer in contact with the second substrate, the second layer extending to a second layer edge and including one or more second micro-wire electrodes and one or more second connection pads, each second micro-wire electrode including one or more electrically connected second micro-wires, and each second connection pad electrically connected to a corresponding second micro-wire electrode; and
wherein the second layer is located between the first substrate and the second substrate and wherein the second layer edge extends at least partly beyond the first layer edge so that one or more of the second connection pads is located between at least a portion of the first layer edge and the second layer edge.

2. The multi-layer micro-wire structure of claim 1, wherein the second substrate is a substrate or cover of a display device.

3. The multi-layer micro-wire structure of claim 1, wherein the first substrate and the second substrate include common materials and have a common thickness.

4. The multi-layer micro-wire structure of claim 1, wherein the first micro-wires are arranged in a first pattern and the second micro-wires are arranged in a second pattern.

5. The multi-layer micro-wire structure of claim 4, wherein the first substrate has a surface and wherein the second pattern is the same as the first pattern and is spatially out of phase with the first pattern in a direction parallel to the first substrate surface.

6. The multi-layer micro-wire structure of claim 1, wherein the second substrate has a surface opposite the second micro-wires that is a touch surface of a capacitive touch screen.

7. The multi-layer micro-wire structure of claim 1, further including a protective layer located on a side of the first micro-wires opposite the first substrate, the protective layer having a touch surface located on a side of the protective layer opposite the first micro-wires.

8. The multi-layer micro-wire structure of claim 1, wherein the first micro-wires are located in micro-channels formed in the first layer or the second micro-wires are located in micro-channels formed in the second layer.

9. The multi-layer micro-wire structure of claim 1, wherein the first micro-wires extend only partially through the first layer or the second micro-wires extend only partially through the second layer.

10. The multi-layer micro-wire structure of claim 1, wherein the first micro-wires are located on the first layer or form the first layer or the second micro-wires are located on the second layer or form the second layer.

11. The multi-layer micro-wire structure of claim 1, wherein the first layer or the second layer is a cured layer.

12. The multi-layer micro-wire structure of claim 1, wherein the first micro-wires or the second micro-wires are cured micro-wires having sintered conductive particles, are plated micro-wires plated on a seed layer, silver halide micro-wires, or are dried conductive ink micro-wires.

13. The multi-layer micro-wire structure of claim 1, wherein the first and second connection pads are arranged in separate rows.

14. The multi-layer micro-wire structure of claim 1, wherein the first and second connection pads are arranged in a common row.

15. The multi-layer micro-wire structure of claim 1, wherein the first layer edge is crenellated.

16. The multi-layer micro-wire structure of claim 1, wherein the first substrate has a first substrate edge and the first layer edge coincides with the first substrate edge or the second substrate has a second substrate edge and the second layer edge coincides with the second substrate edge.

17. The multi-layer micro-wire structure of claim 1, wherein the first layer edge is orthogonal to the second layer edge, the first connection pads are arranged adjacent to the first layer edge and the second connection pads are arranged adjacent to the second layer edge.

18. The multi-layer micro-wire structure of claim 1, wherein the first substrate has an edge different from the first layer edge and the first connection pads are arranged along and adjacent to the first substrate edge or the second substrate has an edge different from the second layer edge and the second connection pads are arranged along and adjacent to the second substrate edge.

19. The multi-layer micro-wire structure of claim 1, wherein the first micro-wires are sense micro-wires and the second micro-wires are drive micro-wires or wherein the second micro-wires are sense micro-wires and the first micro-wires are drive micro-wires.

20. A capacitive touch screen having the multi-layer micro-wire structure of claim 19.

* * * * *